US012787582B2

(12) United States Patent
Kang

(10) Patent No.: US 12,787,582 B2
(45) Date of Patent: Nov. 3, 2026

(54) DISPLAY DEVICE

(71) Applicant: LG DISPLAY CO., LTD., Seoul (KR)

(72) Inventor: Minji Kang, Seocheon-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/816,633

(22) Filed: Aug. 27, 2024

(65) Prior Publication Data

US 2025/0143118 A1 May 1, 2025

(30) Foreign Application Priority Data

Oct. 25, 2023 (KR) ........................ 10-2023-0143943

(51) Int. Cl.

*H10K 59/131* (2023.01)
*G06F 3/041* (2006.01)
*G06F 3/044* (2006.01)
*G09G 3/3233* (2016.01)
*H10K 59/40* (2023.01)
*H10K 59/80* (2023.01)

(52) U.S. Cl.

CPC ......... *H10K 59/131* (2023.02); *G06F 3/0412* (2013.01); *G06F 3/04164* (2019.05); *G06F 3/0443* (2019.05); *G09G 3/3233* (2013.01); *H10K 59/40* (2023.02); *H10K 59/873* (2023.02); *G06F 2203/04107* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2354/00* (2013.01)

(58) Field of Classification Search

None

See application file for complete search history.

(56) References Cited

U.S. PATENT DOCUMENTS

2018/0151496 A1* 5/2018 Biswas ............... H10W 20/427
2023/0209866 A1* 6/2023 Kong ...................... G06F 3/041 345/173
2024/0153428 A1* 5/2024 Wei ...................... G09G 3/2007
2024/0260342 A1* 8/2024 Ko .......................... H01L 23/50
2025/0234725 A1* 7/2025 Cai ........................ H10K 59/12

* cited by examiner

*Primary Examiner* — Christopher R Lamb
(74) *Attorney, Agent, or Firm* — Fish & Richardson P.C.

(57) ABSTRACT

Disclosed is a display device in which a first source-drain metal line that supplies each of power signals (VOBS, Vini, VAR) to a display panel is broken into short portions spaced from each other by a predefined spacing, such that a difference between a charge amount of a gate metal line and a charge amount of the first source-drain metal line is prevented from increasing. To this end, respective short portions of the first source-drain metal lines adjacent to each other are connected to each other through a second source-drain metal line disposed in a different layer from a layer of the first source-drain metal lines, such that the first source-drain metal lines and the second source-drain metal lines intersect each other to constitute a mesh structure in a plan view of the display device.

27 Claims, 9 Drawing Sheets

DISPLAY DEVICE

CROSS-REFERENCE TO RELATED APPLICATIONS

This application claims priority from Korean Patent Application No. 10-2023-0143943 filed on Oct. 25, 2023 in the Korean Intellectual Property Office, and all the benefits accruing therefrom under 35 U.S.C. 119, the contents of which in its entirety are herein incorporated by reference.

TECHNICAL FIELD

The present disclosure relates to a display device in which charges are prevented from accumulating in a line that supplies power to a pixel to reduce a pixel defect.

BACKGROUND

An organic light-emitting element such as an organic light emitting diode (OLED) includes an anode electrode and a cathode electrode, and an organic compound layer formed therebetween. The organic compound layer is composed of a hole transport layer (HTL), a light-emitting layer (EML), and an electron transport layer (ETL).

When a driving voltage is applied across an anode electrode and a cathode electrode, holes passing through a HTL and electrons passing through an ETL migrate to a light-emitting layer (EML) in which excitons are generated using recombination thereof, such that a EML emits visible light.

An active matrix type organic light-emitting display device includes an OLED that emits light on its own, and thus is used in a variety of ways due to its advantages of fast response speed, high luminous efficiency, high luminance, and large viewing angle.

An organic light-emitting display device includes pixels arranged in a matrix form, each including an organic light-emitting element. A luminance level of each of the pixels is controlled based on a gray level of image data. Each pixel includes the organic light-emitting element, a driving transistor that controls a driving current flowing through the organic light-emitting element based on a difference (gate-source voltage) between a voltage of a gate and a voltage of a source thereof, and at least one switch transistor that programs the gate-source voltage of the driving transistor. The organic light-emitting element, and a pixel circuit including the driving transistor, and the at least one switch transistor operate based on a scan signal and a light-emission control signal.

SUMMARY

The organic light-emitting display device applies scan signals Scan 1, Scan 2, Scan 3, and Scan 4 to the pixel circuit through a scan line, applies a light-emission control signal EM thereto through a light-emission line, and supplies power signals VOBS, Vini, and VAR thereto through a power line.

A gate metal line is used as a scan line or a light-emission line, and a first source-drain metal line is used as a power line.

The first source-drain metal line extends in an elongate manner in a row direction in the display panel during a manufacturing process, and charges may be accumulated on the first source-drain metal line extending in an elongate manner after dry etching.

Therefore, a difference between a charge amount of the gate metal line (e.g., Scan 3) and a charge amount of the first source-drain metal line (e.g., VOBS) connected to a thin-film transistor of each pixel may increase, such that the thin-film transistor breaks down, and creates current or voltage leakage.

To solve the above-described problem, a display device is disclosed. The display device includes a first source-drain metal line that supplies each of the power signals (VOBS, Vini, VAR) to the display panel, and is broken into short portions spaced from each other by a predefined spacing, and the respective short portions of the first source-drain metal lines adjacent to each other are connected to each other such that the difference between the charge amount of the gate metal line and the charge amount of the first source-drain metal line connected to the thin-film transistor of each pixel is prevented from increasing, thereby reducing leakage from the thin-film transistor of each pixel.

Furthermore, a display device includes a first source-drain metal line that supplies each of the power signals (VOBS, Vini, VAR) to the display panel that is separated into short portions spaced from each other by a predefined spacing, and the respective short portions of the first source-drain metal lines adjacent to each other are connected to each other through a second source-drain metal line disposed in a different layer, such that the first source-drain metal lines and the second source-drain metal lines intersect each other to form a mesh structure in a plan view of the display device.

A display device according to some of the present disclosure to achieve the above technical purpose includes a display panel including a display area and a non-display area; at least two or more first metal lines starting to extend from the non-display area and extending in the row direction into the display area, wherein the at least two or more first metal lines are arranged to be spaced from each other in a column direction, and each of the at least two or more first metal lines is broken into broken portions spaced from each other in the row direction by a predetermined spacing; and at least two or more second metal lines disposed in a layer different from a layer in which the at least two or more first metal lines are disposed, wherein each of the at least two or more second metal lines extends in the column direction from a first point overlapping an end of the broken portions of one first metal line to a second point overlapping another first metal line spaced from the one first metal line in the column direction, wherein a first contact hole is positioned at the first point extends vertically to connect the one first metal line and the corresponding second metal line to each other, wherein a second contact hole is positioned at the second point extends vertically to connect the another first metal line and the corresponding second metal line to each other, wherein one side of the corresponding second metal line is connected to the one first metal line via a connection line of the first contact hole at the first point, wherein the other side of the corresponding second metal line is connected to the another first metal line via a connection line of the second contact hole at the second point, wherein in a plan view of the display device, the at least two or more first metal lines and the at least two or more second metal lines constitute a mesh structure.

A display device according to some of the present disclosure to achieve the above technical purpose includes a display panel including a display area and a non-display area; at least two or more first metal lines starting to extend from the non-display area and extending in the row direction into the display area, wherein the at least two or more first metal lines are arranged to be spaced from each other in a column direction, and each of the at least two or more first metal lines is broken into broken portions spaced from each other in the row direction by a predetermined spacing; at least two or more second metal lines disposed in a layer different from a layer in which the at least two or more first metal lines are disposed, wherein each of the at least two or more second metal lines extends in the column direction from a first point overlapping an end of the broken portions of one first metal line to a second point overlapping another first metal line spaced from the one first metal line in the column direction; a light-emission driver configured to supply a light-emission control signal to the display panel through a gate metal line; a gate driver configured to supply a gate signal to the display panel through the gate metal line; a data driver configured to supply a data voltage to the display panel; and a controller configured to control the gate driver and the data driver, wherein a first contact hole is positioned at the first point extends vertically to connect the one first metal line and the corresponding second metal line to each other, wherein a second contact hole is positioned at the second point extends vertically to connect the another first metal line and the corresponding second metal line to each other, wherein one side of the corresponding second metal line is connected to the one first metal line via a connection line of the first contact hole at the first point, wherein the other side of the corresponding second metal line is connected to the another first metal line via a connection line of the second contact hole at the second point, wherein in a plan view of the display device, the at least two or more first metal lines and the at least two or more second metal lines constitute a mesh structure, wherein a bias voltage, an initialization voltage, and an anode reset voltage are supplied to the display panel through the at least two first metal lines and the at least two second metal lines connected to each other. Specific details of other are included in the detailed description and drawings.

The technical solutions according to an aspect of the present disclosure are not limited to those as mentioned above. Other technical solutions not mentioned above may be clearly understood by those skilled in the art from following descriptions set forth below.

In the display device according to aspects of the present disclosure, the first source-drain metal line that supplies each of the power signals (VOBS, Vini, VAR) to the display panel is broken into short portions separated from each other by a predefined spacing, and the respective short portions of the first source-drain metal lines adjacent to each other are connected to each other, such that the difference between the charge amount of the gate metal line and the charge amount of the first source-drain metal line connected to the thin-film transistor of each pixel cannot increase, reducing leakage from the thin-film transistor of each pixel.

Therefore, the difference between a charge amount of the gate metal line (e.g., Scan 3) and a charge amount of the first source-drain metal line (e.g., VOBS) connected to the thin-film transistor of each pixel may be prevented from increasing, such that the thin-film transistor may be prevented from breaking down, and thus the leakage may be suppressed.

In the display device according to an aspect of the present disclosure, the difference between a charge amount of the gate metal line and a charge amount of the first source-drain metal line connected to the thin-film transistor of each pixel may be reduced, such that a voltage difference between the gate-off signal and the initialization signal that causes the bias stress may be reduced to a voltage difference between the gate-off signal and a previous frame voltage.

Furthermore, according to an aspect of the present disclosure, the first source-drain metal line that supplies each of the power signals (VOBS, Vini, VAR) to the display panel is broken into short portions spaced from each other by a predefined spacing. That is, the total length of the first source-drain metal line that supplies each of the power signals (VOBS, Vini, VAR) is reduced. Thus, a resistance value of the first source-drain metal line is lowered, such that the power consumption of the display panel may also be reduced.

Furthermore, according to an aspect of the present disclosure, the thin-film transistor may be prevented from breaking down, and thus the leakage may be suppressed. Thus, an image display quality of each pixel may be improved.

Furthermore, according to an aspect of the present disclosure, the image display quality of the pixel may be improved such that the quality of the product may be improved, and the reliability thereof may be secured, thereby achieving a narrow bezel.

Effects of the present disclosure are not limited to the effects mentioned above, and other effects not mentioned will be clearly understood by those skilled in the art from the description below.

In addition to the above effects, specific effects of the present disclosure are described together while describing specific details for carrying out the present disclosure.

DETAILED DESCRIPTION

Figure 1:
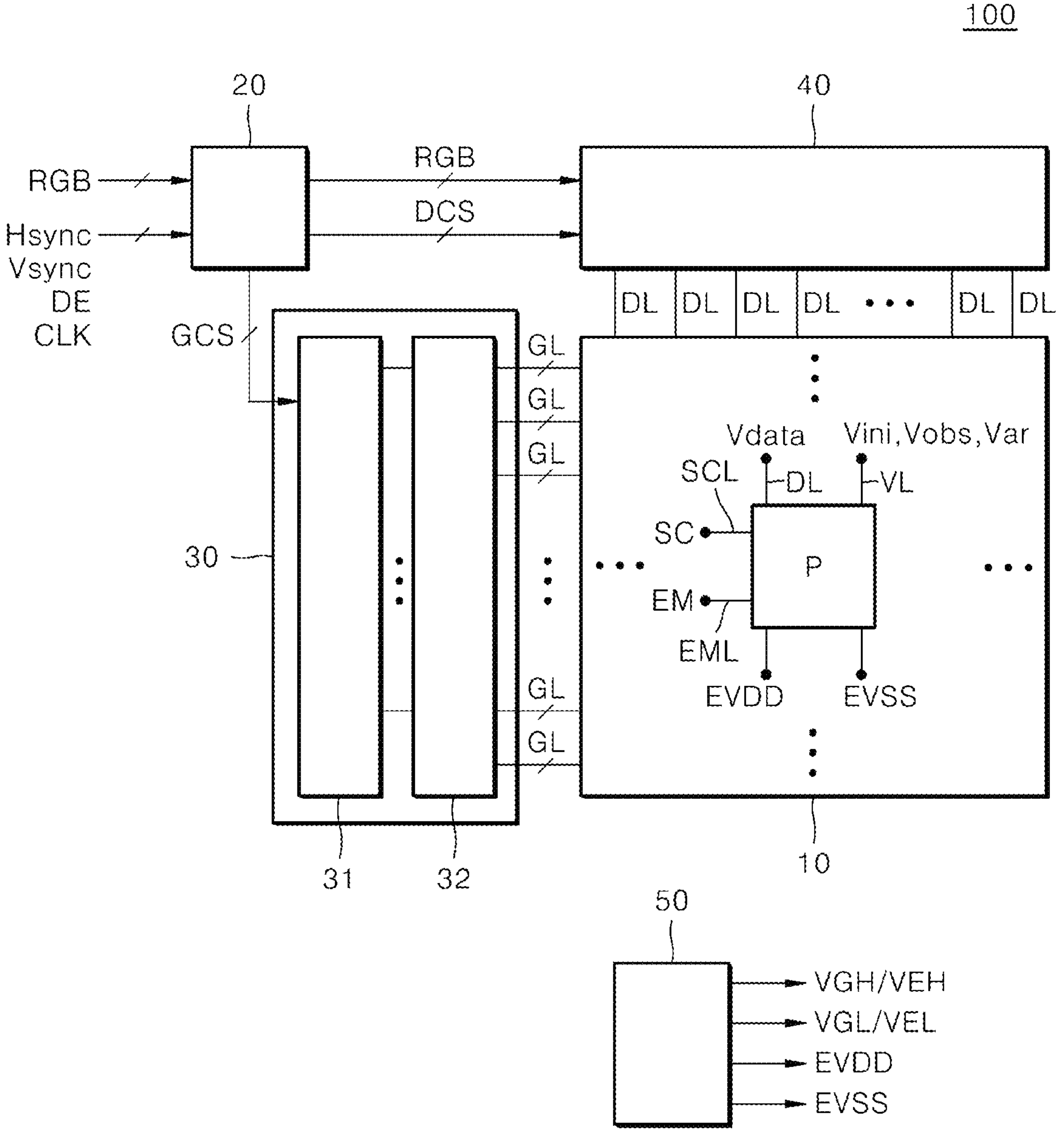
FIG. 1 is a block diagram schematically showing a display device according to an aspect of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are illustrative, and the present disclosure is not limited thereto.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

When a certain aspect may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or periods, these elements, components, regions, layers and/or periods should not be limited by these terms. These terms are used to distinguish one element, component, region, layer or section from another element, component, region, layer or period. Thus, a first element, component, region, layer or section as described under could be termed a second element, component, region, layer or period, without departing from the spirit and scope of the present disclosure.

When an aspect may be implemented differently, functions or operations specified within a specific block may be performed in a different order from an order specified in a flowchart. For example, two consecutive blocks may actually be performed substantially simultaneously, or the blocks may be performed in a reverse order depending on related functions or operations.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects, and the like should not be construed such that any aspect or design as described is superior to or advantageous over other aspects or designs.

Further, the term "or" means "inclusive or" rather than "exclusive or". That is, unless otherwise stated or clear from the context, the expression that "x uses a or b" means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for illustrating embodiments.

Further, in a specific case, a term may be arbitrarily selected by the applicant, and in this case, the detailed meaning thereof will be described in a corresponding description period. Therefore, the terms used in the description below should be understood based on not simply the name of the terms, but the meaning of the terms and the contents throughout the Detailed Descriptions.

In description of flow of a signal, for example, when a signal is delivered from a node A to a node B, this may include a case where the signal is transferred from the node A to the node B through another node unless a phrase 'immediately transferred' or 'directly transferred' is used.

Throughout the present disclosure, "A and/or B" means A, B, or A and B, unless otherwise specified, and "C to D" means C inclusive to D inclusive unless otherwise specified.

"At least one" should be understood to include any combination of one or more of listed components. For example, at least one of first, second, and third components means not only a first, second, or third component, but also all combinations of two or more of the first, second, and third components.

Hereinafter, of the present disclosure will be described using the attached drawings. A scale of each of components as shown in the drawings is different from an actual scale thereof for convenience of illustration, and therefore, the present disclosure not limited to the scale as shown in the drawings.

"At least one" should be understood to include any combination of one or more of listed components. For example, at least one of first, second, and third components means not only a first, second, or third component, but also all combinations of two or more of the first, second, and third components.

As used herein, the term "display apparatus" may include, in a narrow sense, a display apparatus including a liquid crystal module (LCM), an organic light-emitting diode (OLED) module, or a quantum dot (QD) module including a display panel and a driver for driving the display panel. Moreover, the display apparatus may include, in a broad sense, a laptop computer, a television, a computer monitor, an automotive device or an equipment display for a vehicle, a set electronic device, a set device or a set device including a complete product or a final product including the LCM, the OLED module, or the QD module.

Therefore, the display apparatus in accordance with the present disclosure may include, in the narrow sense, a display apparatus itself including, for example, the LCM, the OLED module, QD module, etc., and may include, in a broad sense, the set device as an application product or an end-user device including a complete product or a final product including the LCM, the OLED module, or the QD module.

Moreover, in some cases, the LCM, OLED module, or QD module composed of the display panel and the driver may be expressed as "display apparatus" in a narrow sense. The electronic device as a complete product including the LCM, OLED module or QD module may be expressed as "set device" in a broad sense. For example, the display apparatus in the narrow sense may include a display panel such as a liquid crystal panel, an organic light-emitting display panel, or a quantum dot display panel, and a source printed circuit board (PCB) as a controller for driving the display panel. The set device in the broad sense may include a display panel such as a liquid crystal panel, an organic light-emitting display panel, or a quantum dot display panel, a source PCB as a controller for driving the display panel, and a set PCB as a set controller that is electrically connected to the source PCB and controls the set device.

As used herein, the display panel may be of any type of the display panels such as a liquid crystal display panel, an OLED display panel, a QD display panel, and an electroluminescent display panel, etc. The display panel used in the disclosure may be not limited to a specific display panel. Moreover, the display panel used in the display device according to an aspect of the present disclosure is not limited to a shape or a size of the display panel.

Hereinafter, a display device according to an aspect of the present disclosure will be described with reference to the drawings.

FIG. 1 is a block diagram schematically showing a display device according to an aspect of the present disclosure.

Referring to FIG. 1, a display device 100 according to an aspect of the present disclosure may include a display panel 10 including a plurality of pixels P, a controller 20, a gate driver 30 for supplying a gate signal to the display panel 10, a data driver 40 for supplying a data signal to the display panel 10, and a power supply 50 for supplying a power for driving the display panel 10 thereto.

The display panel 10 includes the plurality of pixels P. The display panel 10 may include a display area AA (see FIG. 3) where the plurality of pixels P is located, and a non-display area NA (see FIG. 3) surrounding the display area. The gate driver 30, the data driver 40, and the controller 20 are disposed in the non-display area NA.

The controller 20 controls the gate driver 30 and the data driver 40. The gate driver 30 supplies the gate signal to the display panel 10. The data driver 40 supplies the data signal to the display panel 10. The power supply 50 supplies the power necessary to drive the display panel 10 thereto.

In the display panel 10, a plurality of gate lines GL and a plurality of data lines DL intersect each other, and each of the plurality of pixels P are connected to the gate line GL and the data line DL. Specifically, one pixel P receives the gate signal from the gate driver 30 through the gate line GL, receives the data signal from the data driver 40 through the data line DL, and receives a high potential driving voltage EVDD and a low potential driving voltage EVSS from the power supply 50 through a power supply line (not shown).

In this regard, the gate line GL supplies a scan signal SC and a light-emission control signal EM to the pixel and the data line DL supplies a data voltage Vdata to the pixel. Furthermore, according to various, the gate line GL may include a plurality of scan lines SCL that supply the scan signal SC and a light-emission control signal line EML that supplies the light-emission control signal EM. Furthermore, the plurality of pixels P may additionally include a power line VL and may receive a bias voltage Vobs, a hold voltage Var, and an initialization voltage Vini through the power line VL.

Figure 2:
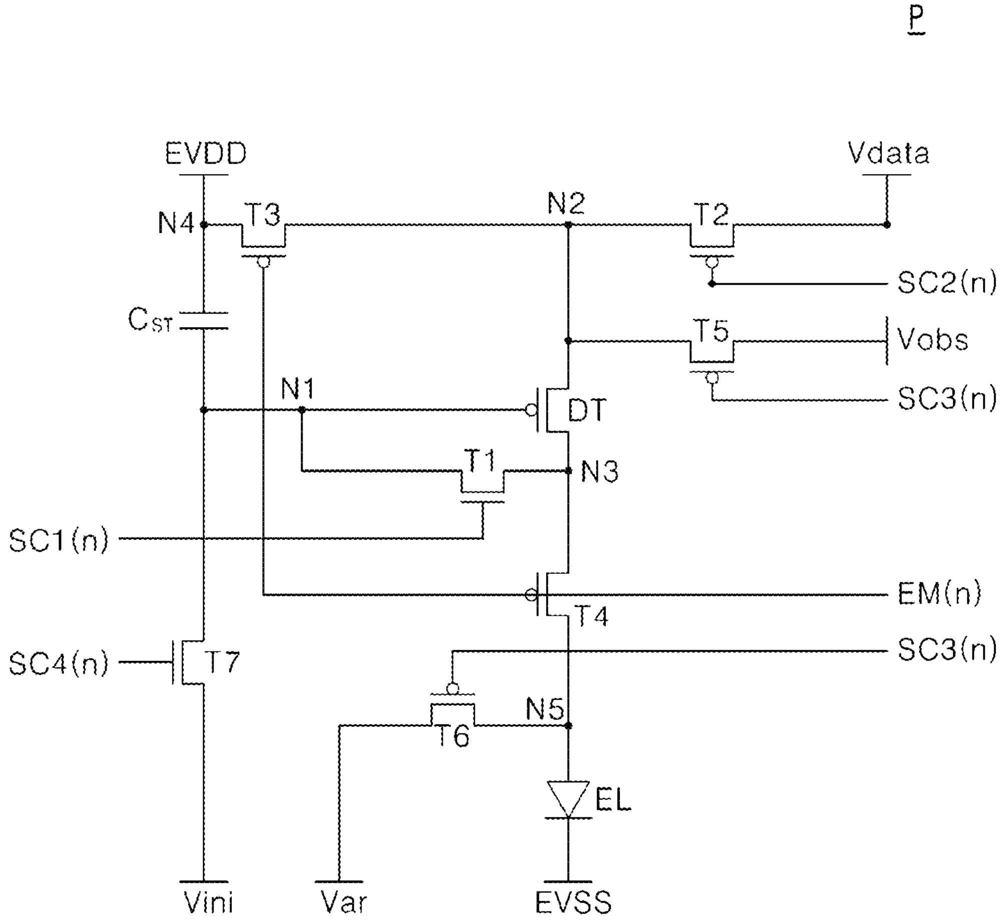
FIG. 2 is a diagram showing a pixel circuit of a display device according to an aspect of the present disclosure.
Figure 3:
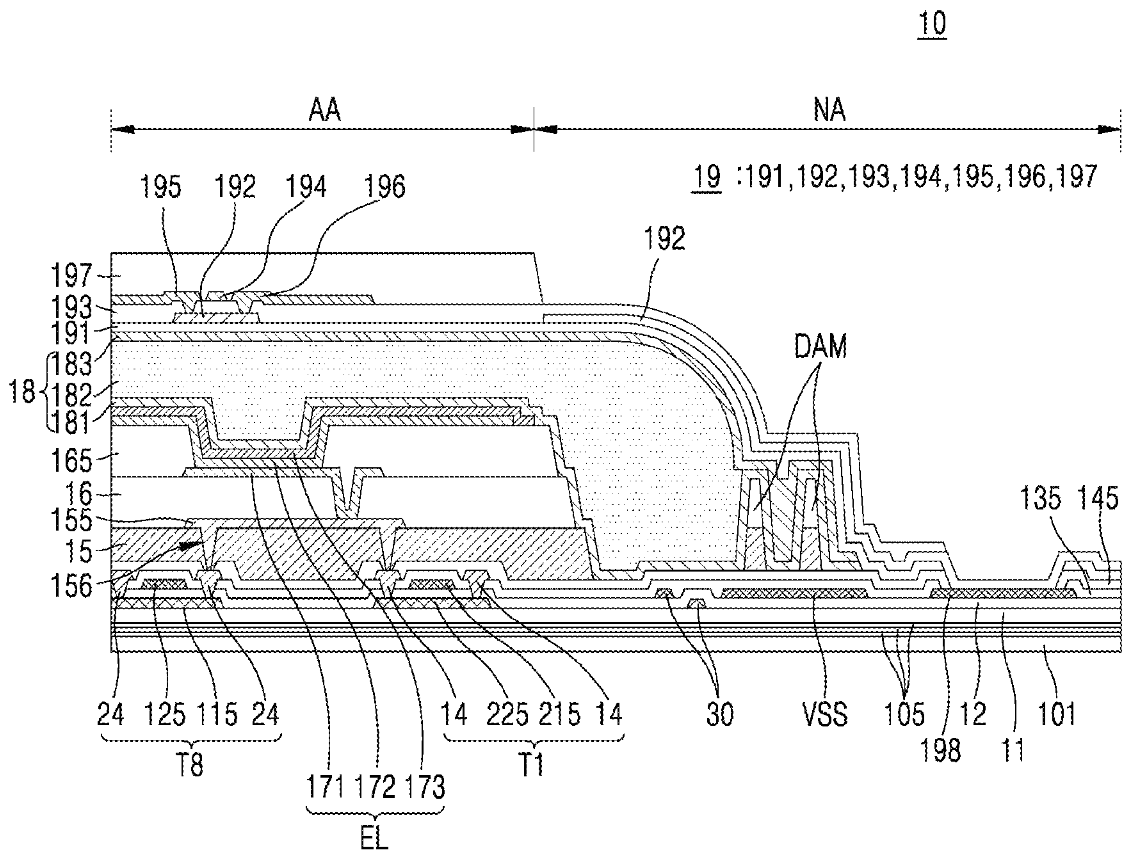
FIG. 3 is a cross-sectional view showing a stack structure of a display device according to an aspect of the present disclosure.

Furthermore, each pixel P includes a light-emitting element EL and a pixel circuit that controls an operation of the light-emitting element EL as shown in FIG. 2. In this regard, the light-emitting element EL is composed of an anode electrode 171, a cathode electrode 173, and a light-emitting layer 172 between the anode electrode 171 and the cathode electrode 173, as shown in FIG. 3.

The pixel circuit includes a plurality of switching elements, a driving element, and a capacitor. In this regard, each of the switching element and the driving element may be embodied as a thin-film transistor. In the pixel circuit, the driving element controls an amount of current supplied to the light-emitting element EL based on the data voltage to adjust an amount of light emitted from the light-emitting element EL. Furthermore, the plurality of switching elements receives a scan signal SC supplied through a plurality of scan lines SCL and a light-emission control signal EM supplied through a light-emission control signal line EML, and operates the pixel circuit based on the scan signal SC and the light-emission control signal EM. As used herein, the light-emission control signal EM may be simply referred to as light-emission control signal EM. The light-emission control signal line EML may simply be referred to as a light-emission line.

The display panel 10 may be a non-transmissive display panel or a transmissive display panel. The transmissive display panel may be applied to a transparent display device where an image is displayed on a screen and a real object in a background is visible to a viewer in front of the display device. The display panel 10 may be manufactured as a flexible display panel. The flexible display panel may be an OLED panel using a plastic substrate.

The pixels P may include a red pixel, a green pixel, and a blue pixel to emit light of corresponding colors. The pixels P may further include a white pixel. Each of the pixels P includes a pixel circuit.

Touch sensors may be disposed on the display panel 10. Touch input may be sensed using separate touch sensors or may be sensed through the pixels P. The touch sensors may be disposed on the screen of the display panel in an on-cell type or add-on type or may be an in-cell type touch sensors built into the display panel 10.

The controller 20 processes image data RGB input from an external source such as a host system to be adapted to a size and a resolution of the display panel 10 and supplies the processed image data to the data driver 40. The controller 20 generates a gate control signal GCS and a data control signal DCS based on synchronization signals, for example, a clock signal CLK, a data enable signal DE, a horizontal synchronization signal Hsync, and a vertical synchronization signal Vsync input from the external source, and supplies the generated gate control signal GCS and data control signal DCS to the gate driver 30 and the data driver 40, respectively, thereby controlling the gate driver 30 and the data driver 40.

The controller 20 may be configured to be coupled to various processors, for example, a microprocessor, a mobile processor, an application processor, etc., depending on a type of a device on which the controller is mounted. The controller 20 may be a timing controller.

The host system may be any one of a television (TV) system, a set top box, a navigation system, a personal computer (PC), a home theater system, a mobile device, a wearable device, and a vehicle system.

The controller 20 multiplies an input frame frequency by i and controls an operation timing of each of the gate driver 30 and the data driver 40 using a frame frequency=the input frame frequency×i (i is a positive integer greater than 0) Hz. For example, the input frame frequency is 60 Hz for the National Television Standards Committee (NTSC) scheme and is 50 Hz for the Phase-Alternating Line (PAL) scheme.

The controller 20 generates a signal so that the pixel may operate at various refresh rates. That is, the controller 20 generates operation-related signals such that the pixel may operate in a Variable Refresh Rate (VRR) mode or a refresh rate thereof may be switchable between a first refresh rate and the second refresh rate. For example, the controller 20 may change a rate of a clock signal, generate a synchronization signal to generate a horizontal blank or a vertical blank, or operate the gate driver 30 in a masked manner such that the pixel P may operate at various refresh rates.

The controller 20 generates, based on the timing signals Vsync, Hsync, and DE received from the host system, the gate control signal GSC for controlling the operation timing of the gate driver 30, and the data control signal DSC for controlling the operation timing of the data driver 40. The controller 20 controls the operation timings of the gate driver 30 and the data driver 40 to synchronize the gate driver 30 and the data driver 40 with each other.

A level shifter (not shown) converts a voltage level of the gate control signal GSC output from the controller 20 into a gate on voltage VGL and VEL and a gate off voltage VGH and VEH which in turn are supplied to the gate driver 30. The level shifter converts a low level voltage of the gate control signal GSC to a gate low voltage VGL, and converts a high level voltage of the gate control signal GSC to a gate high voltage VGH. The gate control signal GSC includes a start pulse and a shift clock.

The gate driver 30 supplies the scan signal SC to the gate line GL according to the gate control signal GCS supplied from the controller 20. The gate driver 30 may be disposed at one side or each of both opposing sides of the display panel 10 and in a GIP (Gate In Panel) manner.

The gate driver 30 sequentially outputs the gate signal to the plurality of gate lines GL under control of the controller 20. The gate driver 30 may shift the gate signal using a shift register and sequentially supply the shifted gate signal to the gate lines GL.

The gate signal may include the scan signal SC and the light-emission control signal EM in an organic light-emitting display device. The scan signal SC includes a scan pulse swinging between the gate on voltage VGL and the gate off voltage VGH. The light-emission control signal may include a light-emission control signal pulse that swings between the gate on voltage VEL and the gate off voltage VEH.

The scan pulse is synchronized with the data voltage Vdata to select pixels of a line to which the data voltage is to be written. The light-emission control signal EM may define a light-emission time of each of pixels. The light-emission control signal EM may be a switching signal that turns on each transistor.

The gate driver 30 may include a light-emission control signal driver 31 and at least one scan driver 32.

The light-emission control signal driver 31 outputs the light-emission control signal pulse in response to the start pulse and the shift clock received from the controller 20 and sequentially shifts the light-emission control signal pulse according to the shift clock. The light-emission control signal driver 31 may be simply referred to as a light-emission driver 31.

Each of the at least one scan driver 32 outputs the scan pulse in response to the start pulse and the shift clock received from the controller 20, and shifts the scan pulse according to a shift clock timing.

The data driver 40 converts the image data RGB into the data voltage Vdata according to the data control signal DCS supplied from the controller 20, and supplies the converted data voltage Vdata to the pixel P through the data line DL.

In FIG. 1, one data driver 40 is disposed at one side of the display panel 10. However, the number and a position of the data drivers 200 are not limited thereto.

That is, the data driver 40 may be embodied as a plurality of integrated circuits (ICs) which may be disposed at one side of the display panel 10 and may be separately arranged along the one side.

The power supply 50 generates direct current (DC) power for operating a pixel array of the display panel 10 and the display panel driver including the data driver 40 and the gate driver 30, using a DC-DC converter. The DC-DC converter may include a charge pump, a regulator, a buck converter, a boost converter, etc. The power supply 50 receives a DC input voltage applied from the host system (not shown) and generates DC voltages such as the gate on voltage VGL and VEL, the gate off voltage VGH and VEH, the high-potential driving voltage EVDD, the low-potential driving voltage EVSS, etc. The gate on voltage VGL and VEL and the gate off voltage VGH and VEH are supplied to the level shifter (not shown) and the gate driver 30. Each of the high-potential driving voltage EVDD and the low-potential driving voltage EVSS is commonly supplied to the pixels.

FIG. 2 is a diagram showing a pixel circuit of a display device according to an aspect of the present disclosure.

FIG. 2 shows an example of a pixel circuit for illustration. A structure of the pixel circuit is not limited particularly as long as the structure thereof may apply a light-emission control signal EM(n) to the pixel to control the light-emission of the light-emitting element EL. For example, the pixel circuit may include a switching thin-film transistor connected to an additional scan signal, and a switching thin-film transistor to which an additional initialization voltage is applied. A connection relationship of the switching element or a connection position of the capacitor may vary. Hereinafter, for convenience of description, a display device with the pixel circuit structure of FIG. 2 is described.

The display panel 10 according to an aspect of the present disclosure may include the plurality of pixels P. Referring to FIG. 2, each of the plurality of pixels P according to an aspect of the present disclosure may include a pixel circuit having a driving transistor DT and the light-emitting element EL connected to the pixel circuit.

The pixel circuit may drive the light-emitting element EL by controlling the driving current flowing through the light-emitting element EL. The pixel circuit may include the driving transistor DT, first to seventh transistors T1 to T7, and a capacitor Cst. Each of the transistors DT, T1 to T7 may include a first electrode, a second electrode, and a gate electrode. One of the first electrode and the second electrode may be a source electrode, and the other of the first electrode and the second electrode may be a drain electrode.

Each of the transistors DT and T1 to T7 may be a P-type thin-film transistor or an N-type thin-film transistor. In an aspect of FIG. 2, each of the first transistor T1, and the seventh transistor T7 is embodied as an N-type thin-film transistor, and each of the remaining transistors DT, and T2 to T6 is embodied as a P-type thin-film transistor. However, the present disclosure is not limited thereto, and depending on an aspect, all or some of the transistors DT, and T1 to T7 may be P-type thin-film transistors or N-type thin-film transistors. Furthermore, the N-type thin-film transistor may be an oxide thin-film transistor (Oxide TFT), and the P-type thin-film transistor may be a low-temperature polycrystalline silicon (LTPS) thin-film transistor.

Hereinafter, an example in which each of the first transistor T1, and the seventh transistor T7 is embodied as the N-type thin-film transistor, and each of the remaining transistors DT, and T2 to T6 is embodied as the P-type thin-film transistor is described. Therefore, each of the first transistor T1 and the seventh transistor T7 may be turned on based on a high voltage applied thereto, and each of the remaining transistors DT, and T2 to T6 may be turned on based on a low voltage applied thereto.

According to one example, the first transistor T1 of the pixel circuit may act as a compensation transistor, the second transistor T2 of the pixel circuit may act as a data supply transistor. Each of the third and fourth transistors T3 and T4 of the pixel circuit may act as a light-emission control transistor. The second transistor T2 constituting the pixel circuit may act as a data supply transistor. The fifth transistor T5 constituting the pixel circuit may function as a bias transistor, and each of the sixth and seventh transistors T6 and T7 constituting the pixel circuit may function as an initialization transistor. The sixth transistor T6 may function as a reset transistor for resetting an anode electrode of the light-emitting element EL among the initialization transistors.

The light-emitting element EL may include a first electrode and a second electrode. The first electrode of the light-emitting element EL may be the anode electrode 171, and the second electrode of the light-emitting element EL may be the cathode electrode 173. The light-emitting element EL may include the first electrode connected to a fifth node N5, and the second electrode connected to a low driving voltage. That is, the anode electrode 171 of the light-emitting element EL may be connected to the fifth node N5, and the cathode electrode 173 thereof may be connected to a low-potential driving voltage EVSS.

The driving transistor DT may include a second electrode connected to a third node N3, a first electrode connected to a second node N2, and a gate electrode connected to a first node N1. The driving transistor DT may provide a driving current Id to the light-emitting element EL based on a voltage of the first node N1 (or the data voltage stored in the capacitor Cst) which will be described later.

The first transistor T1 may include a first electrode connected to the third node N3, a second electrode connected to the first node N1, and a first gate electrode that receives a first scan signal SC1(*n*). The first transistor T1 may be turned on in response to the first scan signal SC1(*n*), and thus may be connected in a diode manner to and disposed between the first node N1 and the third node N3 to sample a threshold voltage Vth of the driving transistor DT. This first transistor T1 may be a compensation transistor.

The capacitor Cst may be connected to and disposed between the first node N1 and a fourth node N4. The capacitor Cst may store or maintain a high potential driving voltage EVDD provided thereto.

The fifth transistor T5 may include a first electrode receiving the bias voltage Vobs, a second electrode connected to the second node N2, and a fifth gate electrode receiving a third scan signal SC3(*n*). This fifth transistor T5 may be a bias transistor.

The sixth transistor T6 may include a first electrode receiving the anode reset voltage Var, a second electrode connected to the fifth node N5, and a sixth gate electrode receiving the third scan signal SC3(*n*). The first electrode of the sixth transistor T6 may be connected to a reset voltage line.

Before the light-emitting element EL emits light (or after the light-emitting element EL emits light), the sixth transistor T6 may be turned on in response to the third scan signal SC3(*n*) to reset the anode electrode (or a pixel electrode) of the light-emitting element EL using the anode reset voltage Var. The light-emitting element EL may have a parasitic capacitor generated between the anode electrode and the cathode electrode. While the light-emitting element EL emits light, the parasitic capacitor may be charged so that the anode electrode of the light-emitting element EL may have a specific voltage. Therefore, the anode reset voltage Var may be applied to the anode electrode of the light-emitting element EL through the sixth transistor T6, such that an amount of charges accumulated in the light-emitting element EL may be initialized.

In the present disclosure, the fifth and sixth transistors T5 and T6 are configured such that the gate electrodes of the fifth and sixth transistors T5 and T6 receive separate scan signals and the fifth and sixth transistors T5 and T6 operate independently. However, aspects of the present disclosure are not necessarily limited thereto. The fifth and sixth transistors T5 and T6 are configured such that the gate electrodes of the fifth and sixth transistors T5 and T6 commonly receive the third scan signal SC3(*n*).

The seventh transistor T7 may include a first electrode receiving the initialization voltage Vini, a second electrode connected to the first node N1, and a gate electrode receiving a fourth scan signal SC4(*n*).

The seventh transistor T7 may be turned on in response to the fourth scan signal SC4(*n*) such that the gate electrode of the driving transistor DT may be initialized using the initialization voltage Vini. Unnecessary charges may remain in the gate electrode of the driving transistor DT due to the high potential driving voltage EVDD stored in the capacitor Cst. Therefore, the initialization voltage Vini may be applied to the gate electrode of the driving transistor DT through the seventh transistor T7, such that the remaining charge amount may be initialized.

As shown in FIG. 2, the first thin-film transistor T1 as the low-temperature polycrystalline silicon (LTPS) thin-film transistor may be disposed between and connected to the gate electrode N1 and the source electrode N3 of the driving transistor DT, such that the voltage difference between the gate-off signal and the initialization signal that causes the bias stress may be reduced to a voltage difference between the gate-off signal and the previous frame voltage.

The second transistor T2 may include the first electrode connected to the data line DL or receiving the data voltage Vdata, the second electrode connected to the second node N2, and the gate electrode receiving the second scan signal SC2(*n*). The second transistor T2 may be turned on in response to the second scan signal SC2(*n*) to transmit the data voltage Vdata to the second node N2. This second transistor T2 may be a data voltage supply transistor.

The third transistor T3 and the fourth transistor T4 (or first and second light-emission control transistors) may be connected to and disposed between the high-potential driving voltage EVDD and the light-emitting element EL, and may form a current path along which the driving current Id generated from the driving transistor DT travels.

The third transistor T3 may include a first electrode connected to the fourth node N4 to receive the high potential driving voltage EVDD therefrom, a second electrode connected to the second node N2, and a third gate electrode to receive the light-emission control signal EM(n).

The fourth transistor T4 may include a first electrode connected to the third node N3, a second electrode connected to the fifth node N5 (or the anode electrode of the light-emitting element EL), and a fourth gate electrode that receives the light-emission control signal EM(n).

The third and fourth transistors T3 and T4 may be turned on in response to the light-emission control signal EM(n) and apply the driving current Id to the light-emitting element EL. Thus, the light-emitting element EL may emit light at a luminance level corresponding to the driving current Id.

In FIG. 2, when the fifth transistor T5 as a bias transistor has been turned on, the bias voltage Vobs may be applied to the driving transistor DT through a first metal line for supplying the bias voltage among at least or more two first metal lines.

Furthermore, when the sixth transistor T6 as a reset transistor has been turned on, the anode reset voltage Var may be applied to the anode electrode as the first electrode N5 of the light-emitting element EL through a first metal line for supplying the anode reset voltage among the at least two or more first metal lines.

Furthermore, when the seventh transistor T7 has been turned on, the initialization voltage Vini may be applied to the gate electrode of the driving transistor DT connected to the first node N1 through a first metal line for initialization voltage supply among the at least two or more first metal lines.

Furthermore, the display device 100 may further include at least two scan lines GL that start to extend from the non-display area NA and extend in the row direction and are disposed adjacent to each other in the display area AA.

The fifth transistor T5 and the sixth transistor T6 may be turned on based on the third scan signal SC3(*n*) applied thereto through a third scan line SC3 among the at least two scan lines GL. The seventh transistor T7 may be turned on based on the fourth scan signal SC4(*n*) applied thereto through a fourth scan line SC4 among the at least two or more scan lines GL.

FIG. 3 is a cross-sectional view showing a stack structure of a display device according to the aspect of the present disclosure.

Referring to FIG. 3, the display device 100 according to an aspect of the present disclosure may include a substrate 101 including the display area AA and the non-display area NA, and the fourth transistor T4 disposed on the display area AA thereof and acting as a light-emission transistor for driving the light-emitting element EL on the display area AA. The fourth transistor T4 may include a fourth semiconductor layer 115, a fourth gate electrode 125, and source and drain electrodes 14 as the first electrode and the second electrode, respectively.

Furthermore, in the display device 100 according to an aspect of the present disclosure, the sixth transistor T6 as a reset transistor for resetting the anode electrode of the light-emitting element EL may be disposed on the display area AA of the substrate 101. The sixth transistor T6 may include a sixth semiconductor layer 215, a sixth gate electrode 225, and source and drain electrodes 24 as the first electrode and the second electrode, respectively.

For convenience of illustration, only the fourth transistor T4 and the sixth transistor T6 are shown among the various thin-film transistors that may be included in the display device 100. However, other thin-film transistors such as switching transistors may also be included in the display device 100. Furthermore, in the present disclosure, an example in which the thin-film transistor TFT has a coplanar structure is described. However, the thin-film transistor TFT may be implemented to have other structures such as a staggered structure. The present disclosure is not limited thereto.

The fourth transistor T4 may receive the high-potential driving voltage EVDD in response to the light-emission control signal EM supplied to the fourth gate electrode 125 to control the current supplied to the light-emitting element EL to control the amount of light emitted from the light-emitting element EL, and to supply a constant current to the light-emitting element EL based on the voltage charged in the storage capacitor Cst to maintain light emission of the light-emitting element EL until a data signal of a next frame is supplied thereto. The high potential supply line may extend in a parallel manner to the data line.

The sixth transistor T6 may receive the reset voltage signal Var in response to the light-emission control signal EM and transfer the reset voltage signal Var to the anode electrode N5 as the first electrode of the light-emitting element EL, such that the anode electrode of the light-emitting element EL may be reset.

As shown in FIG. 3, the fourth transistor T4 may include the fourth semiconductor layer 115 disposed on a first insulating layer 11, the fourth gate electrode 125 that overlaps the fourth semiconductor layer 115 while a second insulating layer 12 is disposed therebetween, and the source and drain electrodes 14 disposed on a third insulating layer 135 and in contact with the fourth semiconductor layer 115. When the first electrode of the fourth transistor T4 is a source electrode, the second electrode thereof may be a drain electrode. Conversely, when the first electrode thereof is a drain electrode, the second electrode thereof may be a source electrode. The fourth transistor T4 may include a P-type (P-MOSFET) thin-film transistor TFT and a low temperature polycrystalline silicon (LTPS) thin-film transistor TFT.

As shown in FIG. 3, the sixth transistor T6 may include the sixth semiconductor layer 215 disposed on the first insulating layer 11, the sixth gate electrode 225 that overlaps the sixth semiconductor layer 215 while the second insulating layer 12 is disposed therebetween, and the source and drain electrodes 24 are disposed on the third insulating layer 135 and in contact with the sixth semiconductor layer 215. When the first electrode of the sixth transistor T6 is a source electrode, the second electrode thereof may be a drain electrode. Conversely, when the first electrode thereof is a drain electrode, the second electrode thereof may be a source electrode. The sixth transistor T6 may include a P-type (P-MOSFET) thin-film transistor TFT and an oxide thin-film transistor TFT.

Each of the fourth semiconductor layer 115 and the sixth semiconductor layer 215 may be an area where a channel is generated when the thin-film transistor TFT operates. Each of the fourth semiconductor layer 115 and the sixth semiconductor layer 215 may be made of an oxide semiconductor, amorphous silicon (a-Si), polycrystalline silicon (poly-Si), or various organic semiconductors such as pentacene, etc. However, aspects of the present disclosure are not limited thereto. The fourth semiconductor layer 115 and the sixth semiconductor layer 215 may be formed on the first insulating layer 11. Each of the fourth semiconductor layer 115 and the sixth semiconductor layer 215 may include a channel area, a source area, and a drain area. The channel area of the fourth semiconductor layer 115 may overlap the fourth gate electrode 125 while the second insulating layer 12 is disposed therebetween, thereby forming a channel area between the source and drain electrodes. The channel area of the sixth semiconductor layer 215 may overlap the sixth gate electrode 225 while the second insulating layer 12 is disposed therebetween, thereby forming a channel area between the source and drain electrodes. The source area may be electrically connected to the source electrode 14 or 24 via a contact hole extending through the second insulating layer 12 and the third insulating layer 135. The drain area may be electrically connected to the drain electrode 14 or 24 via a contact hole extending through the second insulating layer 12 and the third insulating layer 135. A buffer layer 105 and the first insulating layer 11 may be disposed between the fourth semiconductor layer 115 and the sixth semiconductor layer 215 and the substrate 101. The buffer layer 105 may delay the diffusion of moisture and/or oxygen that has penetrated the substrate 101. The first insulating layer 11 protects the fourth semiconductor layer 115 and the sixth semiconductor layer 215 and may block various types of defects flowing from the substrate 101.

The uppermost layer of the buffer layer 105 in contact with the first insulating layer 11 and may be made of a material that has different etching characteristics from etching characteristics of each of the remaining layers of the buffer layer 105, the first insulating layer 11, the second insulating layer 12, and the third insulating layer 135. The uppermost layer of the buffer layer 105 in contact with the first insulating layer 11 may be made of one of silicon nitride (SiNx) and silicon oxide (SiOx). Each of the remaining layers of the buffer layer 105, the first insulating layer 11, the second insulating layer 12, and the third insulating layer 135 may be made of the other of silicon nitride (SiNx) and silicon oxide (SiOx). For example, the top layer of the buffer layer 105 in contact with the first insulating layer 11 may be made of silicon nitride (SiNx), while each of the remaining layers of the buffer layer 105, the first insulating layer 110, the second insulating layer 12, and the third insulating layer 135 may be made of silicon oxide (SiOx). However, aspects of the present disclosure are not limited thereto.

The fourth gate electrode 125 and the sixth gate electrode 225 may be formed on the second insulating layer 12. The fourth gate electrode 125 and the sixth gate electrode 225 may overlap the channel area of the fourth semiconductor layer 115 and the channel area of the sixth semiconductor layer 215, respectively while the second insulating layer 12 is interposed therebetween. Each of the fourth gate electrode 125 and the sixth gate electrode 225 may be made of a first conductive material and may be embodied as a single layer or multi-layers made of magnesium (Mg), molybdenum (Mo), aluminum (Al), chromium (Cr), gold (Au), titanium (Ti), nickel (Ni), neodymium (Nd), copper (Cu), or an alloy thereof. However, aspects of the present disclosure are not limited thereto.

Each of the source electrodes 14 and 24 of the fourth transistor T4 and the sixth transistor T6 may be connected to an exposed source area of each of the fourth semiconductor layer 115 and the sixth semiconductor layer 215 via each contact hole extending through the second insulating layer 12 and the third insulating layer 135. Each of the drain electrodes 14 and 24 of each of the fourth transistor T4 and the sixth transistor T6 may face each of the source electrodes 14 and 24 thereof and may be connected to the drain area of each of the fourth semiconductor layer 115 and the sixth semiconductor layer 215 via each contact hole extending through the second insulating layer 12 and the third insulating layer 135. Each of the source and drain electrodes 14 and 24 may be made of a second conductive material and may be embodied as a single layer or multi-layers made of molybdenum (Mo), aluminum (Al), chromium (Cr), gold (Au), titanium (Ti), nickel (Ni), neodymium (Nd), copper (Cu), or an alloy thereof. However, aspects of the present disclosure are not limited thereto.

A connection electrode 155 may be disposed between a first middle layer 15 and a second middle layer 16. A portion of the connection electrode 155 may be exposed through a connection electrode contact hole 156 extending through a protective film 145 and the first middle layer 15 such that the exposed portion thereof may be connected to the drain electrodes 14 and 24. The connection electrode 155 may be made of the same or similar low resistivity material as a material of each of the drain electrodes 14 and 24. However, aspects of the present disclosure are not limited thereto.

Referring to FIG. 3, the light-emitting element EL including a light-emitting layer 172 may be disposed on the second middle layer 16 and a bank layer 165. The light-emitting element EL may include an organic light-emitting diode (OLED). The first electrode of the light-emitting element EL may be the anode electrode, and the second electrode of the light-emitting element EL may be the cathode electrode.

The light-emitting element EL may include the anode electrode 171, at least one light-emitting layer 172 formed on the anode electrode 171, and the cathode electrode 173 formed on the light-emitting layer 172.

The anode electrode 171 may be electrically connected to an exposed portion of the connection electrode 155 disposed on the first middle layer 15 and not covered with the second middle layer 16 via a contact hole extending through the second middle layer 16.

The anode electrode 171 of each pixel is not covered with the bank layer 165 to be exposed. The bank layer 165 may be made of an opaque material (e.g., black) to prevent light interference between adjacent pixels. In this case, the bank layer 165 may include a light-shielding material including at least one of color pigment, organic black, and carbon black. The present disclosure is not limited thereto.

Referring to FIG. 3, the at least one light-emitting layer 172 may be formed on a portion of the anode electrode 171 corresponding to a light-emitting area defined by the bank layer 165. The at least one light-emitting layer 172 may include a hole transport layer, a hole injection layer, a hole blocking layer, a light-emitting layer, an electron injection layer, an electron blocking layer, and an electron transport layer on the anode electrode 171. A stacking order of the hole transport layer, the hole injection layer, the hole blocking layer, the light-emitting layer, the electron injection layer, the electron blocking layer, and the electron transport layer may be based on a light-emitting direction. In addition, the light-emitting layer 172 may include first and second light-emitting stacks facing each other while a charge generating layer is interposed therebetween. In this case, the light-emitting layer 172 of one of the first and second light-emitting stacks may generate blue light, while the light-emitting layer 172 of the other of the first and second light-emitting stacks may generate yellow-green light, so that white light may be generated from a combination of the first and second light-emitting stacks. The white light generated from the combination of the first and second light-emitting stacks may be incident on a color filter positioned above or below the light-emitting layer 172, such that a color image may be realized. In another example, each light-emitting layer 172 may generate each color light corresponding to each pixel without a separate color filter such that a color image may be rendered. For example, the light-emitting layer 172 of a red (R) pixel emits red light, the light-emitting layer 172 of a green (G) pixel emits green light, and the light-emitting layer 172 of a blue (B) pixel emits blue light.

Referring to FIG. 3, the cathode electrode 173 as the second electrode of the light-emitting element EL may be formed to face the anode electrode 171 thereof while the light-emitting layer 172 is disposed therebetween, and may receive the high-potential driving voltage EVDD.

An encapsulation layer 18 may be disposed. The encapsulation layer 18 may prevent external moisture or oxygen from penetrating into the light-emitting element EL that is vulnerable to external moisture or oxygen. For this purpose, the encapsulation layer 18 may include at least one inorganic encapsulation layer and at least one organic encapsulation layer. However, aspects of the present disclosure are not limited thereto. In the present disclosure, an example will be described in which the encapsulation layer 18 has a stack structure in which a first encapsulation layer 181, a second encapsulation layer 182, and a third encapsulation layer 183 are sequentially stacked.

The first encapsulation layer 181 is formed on the substrate 101 on which the cathode electrode 173 has been formed. The third encapsulation layer 183 is formed on the substrate 101 on which the second encapsulation layer 182 has been formed. The third encapsulation layer 183 and the first encapsulation layer 181 may surround a top face, a bottom face and a side face of the second encapsulation layer 182. The first encapsulation layer 181 and the third encapsulation layer 183 may minimize or prevent penetration of external moisture or oxygen into the light-emitting element EL. Each of the first encapsulation layer 181 and the third encapsulation layer 183 may be made of an inorganic insulating material that may be deposited at a low temperature, such as silicon nitride ($SiN_x$), silicon oxide ($SiO_x$), silicon oxynitride (SiON), or aluminum oxide ($Al_2O_3$). Each of the first encapsulation layer 181 and the third encapsulation layer 183 is deposited in a low temperature atmosphere. Thus, during a deposition process of the first encapsulation layer 181 and the third encapsulation layer 183, the light-emitting element EL which is vulnerable to a high-temperature atmosphere may be prevented from being damaged.

The second encapsulation layer 182 serves as a shock-absorbing layer to relieve a stress between layers due to bending of the display device 100, and may planarize a step between layers. The second encapsulation layer 182 may be formed on the substrate 101 on which the first encapsulation layer 181 has been formed. The second encapsulation layer 182 may be made of a non-photosensitive organic insulating material such as acryl resin, epoxy resin, phenolic resin, polyamide resin, polyimide resin, polyethylene or silicon oxycarbon (SiOC) or a photosensitive organic insulating material such as photoacryl. The present disclosure is not limited thereto. When the second encapsulation layer 182 is formed using an inkjet method, a dam DAM may be disposed to prevent the second encapsulation layer 182 in a liquid state from spreading to an edge of the substrate 101. The dam DAM may be closer to the edge of the substrate 101 than the second encapsulation layer 182 may be. The dam DAM may prevent the second encapsulation layer 182 in the liquid state from spreading to a pad area where a conductive pad disposed at the outermost side of the substrate 101 is disposed.

The dam DAM prevents diffusion of the second encapsulation layer 182. However, when the second encapsulation layer 182 overflows the dam DAM during a process, the second encapsulation layer 182 as an organic layer may be exposed to an outside, so that moisture or the like may invade the light-emitting element. Therefore, to prevent the overflow, at least ten dams may be stacked.

Referring to FIG. 3, the dam DAM may be disposed on the protective film 145 in the non-display area NA. However, aspects of the present disclosure are not limited thereto.

Further, the dam DAM, and the first middle layer 15 and the second middle layer 16 may be formed simultaneously. The first middle layer 15, and a lower layer of the dam DAM may be formed simultaneously. The second middle layer 16, and an upper layer of the dam DAM may be formed simultaneously. Thus, the dam DAM may have a double layer structure.

Accordingly, the dam DAM may be made of the same material as that of each of the first middle layer 15 and the second middle layer 16. However, aspects of the present disclosure are not limited thereto.

Referring to FIG. 3, the dam DAM may overlap the low-potential driving power line VSS. For example, the low-potential driving power line VSS may be formed in a layer under the dam DAM and in the non-display area NA.

The low-potential driving power line VSS and the gate driver 30 in a form of a gate in panel (GIP) may surround a periphery of the display panel. The low-potential driving power line VSS may be located outwardly of the gate driver 30. Further, the low-potential driving power line VSS may be connected to the anode electrode 171 to apply a common voltage thereto. The gate driver 30 is simply illustrated in plan and cross-sectional views. However, the gate driver 30 may be configured using a thin-film transistor TFT having the same structure as that of each of the thin-film transistors T4 and T6 of the display area AA.

Referring to FIG. 3, the low-potential driving power line VSS is disposed outwardly of the gate driver 30. The low-potential driving power line VSS is disposed outwardly of the gate driver 30 and surrounds the display area AA. The low-potential driving power line VSS may be made of the same material as that of each of the source and drain electrodes 14 and 24 of the thin-film transistors T4 and T6. The present disclosure is not limited thereto. For example, the low-potential driving power line VSS may be made of the same material as that of each of the fourth gate electrode 125 and the sixth gate electrode 225.

Further, the low-potential driving power line VSS may be electrically connected to the anode electrode 171. Alternatively, the low-potential driving power line VSS may be connected to the cathode electrode 173. The low-potential driving power line VSS may supply the low-potential driving voltage EVSS to the plurality of pixels in the display area AA.

A touch layer 19 may be disposed on the encapsulation layer 18. In the touch layer 19, a touch buffer film 191 may be positioned between a touch sensor metal including touch electrode connection lines 192 and 194 and touch electrodes 195 and 196 and the cathode electrode 173 of the light-emitting element EL.

The touch buffer film 191 may prevent chemical (e.g., developer, etchant, etc.) used in a manufacturing process of the touch sensor metal disposed on the touch buffer film 191 or moisture from the outside from invading the light-emitting layer 172 including an organic material. Accordingly, the touch buffer film 191 may prevent damage to the light-emitting layer 172 that is vulnerable to the chemicals or moisture.

The touch buffer film 191 may be made of an organic insulating material that may be formed at a low temperature below or equal to a certain temperature (e.g., 100 degrees Celsius) to prevent damage to the light-emitting layer 172 including the organic material vulnerable to a high temperature, and that has a low dielectric constant of 1 to 3. For example, the touch buffer film 191 may be made of an acryl-based, epoxy-based, or siloxane-based material. The touch buffer film 191 made of the organic insulating material and having planarization performance may prevent damage to the encapsulation layer 18 and fracture of the touch sensor metal formed on the touch buffer film 191 due to bending of the organic light-emitting display device.

According to a mutual-capacitance-based touch sensor structure, the touch electrodes 195 and 196 may be disposed on the touch buffer film 191, and the touch electrodes 195 and 196 may be disposed to intersect each other.

The touch electrode connection lines 192 and 194 may electrically connect the touch electrodes 195 and 196 to each other. The touch electrode connection lines 192 and 194 and the touch electrodes 195 and 196 may be positioned on different layers while the touch insulating film 193 is interposed therebetween.

The touch electrode connection lines 192 and 194 may overlap the bank layer 165, thereby preventing an aperture ratio from being lowered.

In one example, a portion of the touch electrode connection line 192 may extend along upper and side surfaces of the encapsulation layer 18 and upper and side surfaces of the dam DAM and then may be electrically connected to a touch driver circuit (not shown) through a touch pad 198. Thus, the touch electrodes 195 and 196 may be electrically connected to the touch driver circuit.

The portion of the touch electrode connection line 192 may receive a touch driving signal from the touch driver circuit and transmit the same to the touch electrodes 195 and 196 and may receive a touch sensing signal from the touch electrodes 195 and 196 and may transmit the same to the touch driver circuit.

A touch protective film 197 may be disposed on the touch electrodes 195 and 196. In the drawing, it is shown that the touch protective film 197 is disposed only on the touch electrodes 195 and 196. However, aspects of the present disclosure are not limited thereto. The touch protective film 197 may extend to an inner end or an outer end of the dam DAM and thus may also be disposed on the touch electrode connection line 192.

Further, a color filter (not shown) may be further disposed on the encapsulation layer 18, and the color filter may be positioned on the touch layer 19 or between the encapsulation layer 18 and the touch layer 19.

In FIG. 3, the display area AA the display device 100 may have a following stack structure. The buffer layer 105 may be disposed on the substrate 101 including the display area AA and the non-display area NA, and the first insulating layer 11 may be disposed on the buffer layer 105. The fourth semiconductor layer 115 of the fourth transistor T4 and the sixth semiconductor layer 215 of the sixth transistor T6 may be disposed on the first insulating layer 11, and the second insulating layer 12 may be disposed on the first insulating layer 11, the fourth semiconductor layer, and the sixth semiconductor layer.

The low-potential driving power line VSS, the fourth gate electrode 125 of the fourth transistor T4, and the sixth gate electrode 225 of the sixth transistor T6 may be disposed on the second insulating layer 12. The third insulating layer 135 may be disposed on the second insulating layer 12, the low-potential driving power line VSS, the fourth gate electrode 125, and the sixth gate electrode 225. Although not shown in FIG. 3, both the fourth gate electrode 125 and the sixth gate electrode 225 may be in contact with a light-emission signal line.

The first and second electrodes (source and drain electrodes) 14 of the fourth transistor T4 and the first and second electrodes (source and drain electrodes) 24 of the sixth transistor T6 may be disposed on the third insulating layer 135. Each of the first electrode and the second electrode 14 of the fourth transistor T4 may be in contact with the fourth semiconductor layer 115 via a first contact hole. Each of the first electrode and the second electrode 24 of the sixth transistor T6 may be in contact with the semiconductor layer 215 via a second contact hole. The protective film 145 may be disposed on the third insulating layer 135, the first electrode and the second electrode 14 of the fourth transistor T4, and the first electrode and the second electrode 24 of the sixth transistor T6.

The first middle layer 15 may be disposed on the protective film 145 in the display area AA, and the connection electrode 155 may be disposed on the first middle layer 15 in the display area AA. The connection electrode 155 may be in contact with the first electrode or the second electrode 14 of the fourth transistor T4 via a third contact hole 156 and may be in contact with the first electrode or the second electrode 24 of the sixth transistor T6 via another third contact hole 156. Although not shown in FIG. 3, the first or second electrode 14 of the fourth transistor T4 which is not connected to the connection electrode 155 may be in contact with the driving transistor DT. The first or second electrode 24 of the sixth transistor T6 which is not connected to the connection electrode 155 may be in contact with a reset voltage line. The second middle layer 16 may be disposed on the first middle layer 15 and the connection electrode 155 in the display area AA.

The first electrode 171 of the light-emitting element EL may be disposed on the second middle layer 16 in the display area AA. The first electrode 171 of the light-emitting element EL may be in contact with the connection electrode 155 via a fourth contact hole. In the display area AA, the bank layer 165 may be disposed on the second middle layer 16 except for the first electrode 171 of the light-emitting element EL. In the display area AA, the light-emitting layer 172 may be disposed on the bank layer 165 and the first electrode 171 of the light-emitting element EL. The second electrode 173 of the light-emitting element EL may be disposed on the light-emitting layer 172 in the display area AA. The encapsulation layer 18 may be disposed on the second electrode 173 of the light-emitting element EL in the display area AA and on the protective film 145 in the non-display area NA.

Figure 4:
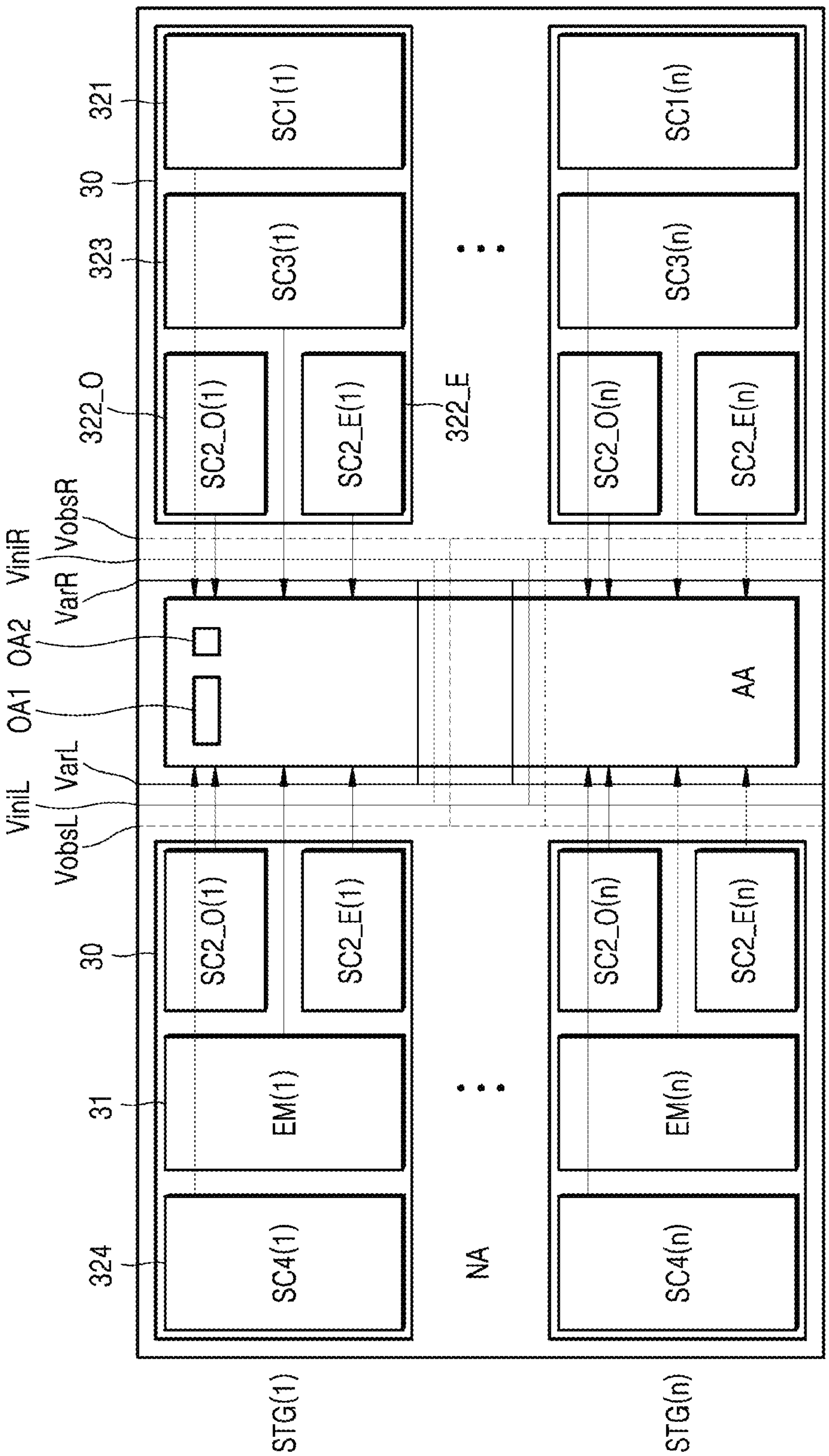
FIG. 4 is a diagram of a configuration of a gate driver in a display device according to an aspect of the present disclosure.

FIG. 4 is a diagram of a configuration of a gate driver in a display device according to an aspect of the present disclosure.

Referring to FIG. 4, the gate driver 30 according to an aspect of the present disclosure may include the light-emission control signal driver 31 and the scan driver 32. The scan driver 32 may include a first scan driver to a fourth scan driver 321, 322, 323, and 324. Further, the second scan driver 322 may be composed of an odd-numbered second scan driver 322_O and an even-numbered second scan driver 322_E.

The gate driver 30 may include shift registers which may be respectively symmetrically disposed on both opposing sides of the display area AA. Further, in the gate driver 30, the shift register on one side of the display area AA may be configured to include the second scan drivers 322_O and 322_E, the fourth scan driver 324 and the light-emission control signal driver 31. The shift register on the other side of the display area AA may be configured to include the first scan driver 321, the second scan drivers 322_O and 322_E, and the third scan driver 323. However, the present disclosure is not limited thereto, and the light-emission control signal driver 31 and the first to fourth scan drivers 321, 322, 323, and 324 may be arranged in a manner varying according to aspects.

Each of stages STG (1) to STG (n) of the shift register may include each of first scan signal generators SC1(1) to SC1(*n*), each of second scan signal generators SC2_O(1) to SC2_O(n) and SC2_E(1) to SC2_E(n), each of third scan signal generators SC3(1) to SC3(*n*), each of fourth scan signal generators SC4(1) to SC4(*n*) and each of light-emission control signal generators EM(1) to EM(n).

The first scan signal generators SC1(*n*) to SC1(*n*) respectively output first scan signals SC1(*n*) to SC1(*n*) through a first scan line SCL1 of the display panel 10. The second scan signal generators SC2(1) to SC2(*n*) respectively output second scan signals SC2(1) to SC2(*n*) through a second scan line SCL2 of the display panel 10. The third scan signal generators SC3(1) to SC3(*n*) respectively output third scan signals SC3(1) to SC3(*n*) through a third scan line SCL3 of display panel 10. The fourth scan signal generators SC4(1) to SC4(*n*) respectively output fourth scan signals SC4(1) to SC4(*n*) through fourth scan line SCL4 of the display panel 10. The light-emission control signal generators EM(1) to EM(n) respectively output light-emission control signals EM(1) to EM(n) through a light-emission signal line EML of the display panel 10.

The first scan signals SC1(*n*) to SC1(*n*) may be used as signals for operating an A-th transistor included in the pixel circuit such as a compensation transistor. The second scan signals SC2(1) to SC2(*n*) may be used as signals for operating a B-th transistor included in the pixel circuit, such as a data supply transistor. The third scan signals SC3(1) to SC3(*n*) may be used as signals for operating a C-th transistor included in the pixel circuit, such as a bias transistor. The fourth scan signals SC4(1) to SC4(*n*) may be used as signals for operating a D-th transistor included in the pixel circuit, such as an initialization transistor. The light-emission control signals EM(1) to EM(n) may be used as signals for operating an E-th transistor included in the pixel circuit, such as a light-emission control transistor. For example, when light-emission control transistors of pixels are controlled using the light-emission control signals EM(1) to EM(n), an emission time of the light-emitting element EL is varied.

Referring to FIG. 4, bias voltage bus lines VobsL and VobsR, first initialization voltage bus lines VarL and VarR, and second initialization voltage bus lines ViniL and ViniR may be disposed between the gate driver 30 and the display area AA.

The bias voltage bus lines VobsL and VobsR, the first initialization voltage bus lines VarL and VarR, and the second initialization voltage bus lines ViniL and ViniR may supply respectively a bias voltage Vobs, a first initialization voltage Var, and a second initialization voltage Vini from the power supply 50 to the pixel circuit.

FIG. 4 illustrates that the bias voltage bus lines VobsL and VobsR are located on the left and right sides of the display area AA, respectively, the first initialization voltage bus lines VarL and VarR are located on the left and right sides of the display area AA, respectively, and the second initialization voltage bus lines ViniL and ViniR are located on the left and right sides of the display area AA, respectively. However, aspects of the present disclosure are limited thereto. Each of the bias voltage bus line, the first initialization voltage bus line, and the second initialization voltage bus line may be located only on the left side or only on the right side of the display area AA. That is, the position of each of the bias voltage bus line, the first initialization voltage bus line, and the second initialization voltage bus line does not limit the display device of the present disclosure.

Referring to FIG. 4, at least one optical area OA1 and OA2 may be disposed in the display area AA.

The at least one optical area OA1 and OA2 may be positioned to overlap at least one optical and electronic device, such as a capturing device such as a camera (an image sensor), and a detection sensor such as a proximity sensor and a luminance sensor.

For operation of the optical electronic device, the at least one optical area OA1 and OA2 may have a light transmissive structure and thus may have a transmittance equal to or greater than a predefined value. In other words, the number of pixels P per unit area in at least one optical area OA1 and OA2 may be smaller than the number of pixels P per unit area in a general area of the display area AA except for the at least one optical area OA1 and OA2. That is, a resolution of at least one optical area OA1 and OA2 may be lower than that of the general area of the display area AA.

The light transmissive structure of the at least one optical area OA1 and OA2 may be formed by patterning a cathode electrode in an area where the pixel P is not disposed. At this time, a portion of the cathode electrode to be patterned may be removed using a laser. Alternatively, the cathode electrode may be selectively formed to be patterned using a material such as a cathode deposition prevention layer.

Alternatively, the light transmissive structure of the at least one optical area OA1 and OA2 may be formed by separately forming the light-emitting element EL and the pixel circuit in the pixel P. In other words, the light-emitting element EL of the pixel P may be positioned on the at least one optical area OA1 and OA2, while a plurality of transistors TFT constituting the pixel circuit may be disposed around the at least one optical area OA1 and OA2, and the light-emitting element EL and the pixel circuit may be electrically connected to each other through a transparent metal layer.

Figure 5:
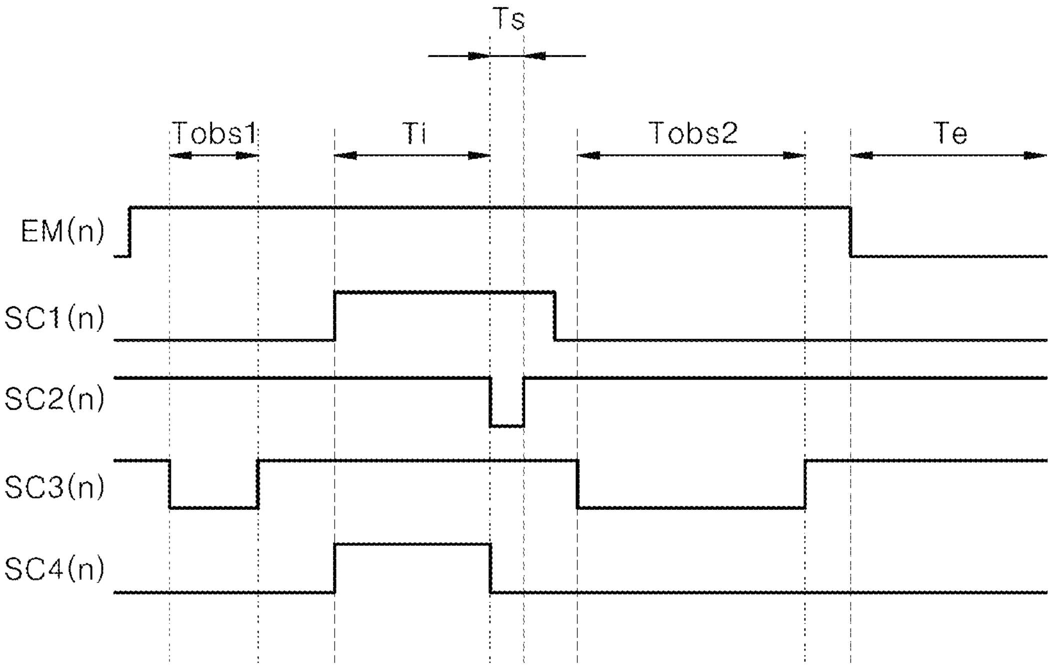
FIG. 5 is a diagram for illustrating application of a scan signal and a light-emission control signal during a refresh period of the pixel circuit as shown in FIG. 2.
Figure 6:
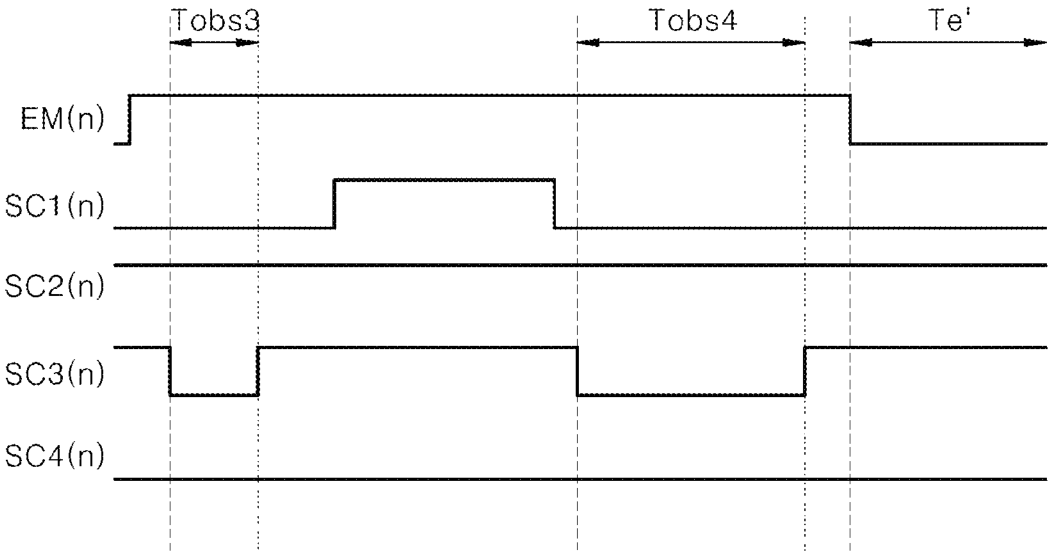
FIG. 6 is a diagram for illustrating application of a scan signal and a light-emission control signal during a hold period of the pixel circuit as shown in FIG. 2.

FIG. 5 and FIG. 6 are diagrams for illustrating application of a scan signal and a light-emission control signal during a refresh period and a hold period of a pixel circuit as shown in FIG. 2 according to an aspect of the present disclosure, respectively.

For example, FIG. 5 is a diagram for illustrating application of the scan signal and the light-emission control signal during the refresh period of the pixel circuit as shown in FIG. 2. FIG. 6 is a diagram for illustrating application of the scan signal and the light-emission control signal during the hold period of the pixel circuit as shown in FIG. 2.

The display device 100 according to an aspect of the present disclosure may operate as a VRR (variable refresh rate) mode display device. In the VRR mode, the display device operates at a variable frequency. When a high-speed operation is required, a refresh rate at which the data voltage Vdata is updated increases. Thus, the pixel operates at the increased refresh rate. When low power consumption or a low-speed operation is required, the refresh rate is lowered such that the pixel operates at the lowered refresh rate.

Each of the plurality of pixels P may operate based on a combination of a refresh period and a hold period within 1 second. In the present disclosure, one set is defined as a combination of a refresh period in which the data voltage Vdata is updated and a hold period in which the data voltage Vdata is not updated for 1 second. The combination of the refresh period and the hold period is repeated on a one set period basis.

When the device operates at a refresh rate of 120 Hz, only the refresh period may be repeated. That is, the refresh period may be repeated 120 times within 1 second. One refresh period period is $1/120$=8.33 ms, and one set period is also 8.33 ms.

When the refresh rate is 60 Hz, the refresh period and the hold period may be repeated alternately with each other. That is, the refresh period and the hold period may be alternately repeated with each other, such that each of the refresh period and the hold period may be repeated 60 times within 1 second. Thus, each of one refresh period period and one hold period is 0.5/60=8.33 ms, and one set period is 16.66 ms.

When the refresh rate is 1 Hz, one frame may be composed of one refresh period, and 119 hold periods subsequent to the one refresh period. Furthermore, when the refresh rate is 1 Hz, one frame may be composed of a plurality of refresh periods and a plurality of hold periods. In this regard, a period of each of one refresh period and one hold period is $1/120$=8.33 ms, and one set period is 1s.

In the refresh period, a new data voltage Vdata is charged to apply the new data voltage Vdata to the driving transistor DT. In the hold period, the data voltage Vdata of a previous frame is maintained. In this regard, the hold period may be referred to as a skip period in the sense that a process of applying the new data voltage Vdata to the driving transistor DT is omitted in the hold period.

Each of the plurality of pixels P may initialize the charged or remaining voltage within the pixel circuit during the refresh period. Specifically, each of the plurality of pixels P may remove the influence of the data voltage Vdata and the high potential driving voltage EVDD stored in a previous frame Frame during the refresh period. Accordingly, each of the plurality of pixels P may display an image corresponding to the new data voltage Vdata in the hold period.

During the hold period, each of the plurality of pixels P may provide the driving current corresponding to the data voltage Vdata to the light-emitting element EL to display an image and may maintain a turned-on state of the light-emitting element EL.

First, with referring to FIG. 5, an operation of each of the pixel circuit and the light-emitting element during the refresh period is described. The refresh period may include at least one bias period Tobs1 and Tobs2, an initialization period Ti, a sampling period Ts, and a light-emission period Te. However, this is only an example and aspect of the present disclosure are not necessarily limited to this order.

Referring to FIG. 5, the refresh period of the pixel circuit may include the at least one bias period Tobs1 and Tobs2. The at least one bias period Tobs1 and Tobs2 refers to a period for which an on-bias stress (OBS) operation in which the bias voltage Vobs is applied is performed, and for which the light-emission control signal EM(n) is at a high voltage level, and the third and fourth transistors T3 and T4 are turned off. During the at least one bias period Tobs1 and Tobs2, each of the first scan signal SC1(*n*) and the fourth scan signal SC4(*n*) is a low voltage level, and the first transistor T1 and the seventh transistor T7 are turned off. During the at least one bias period Tobs1 and Tobs2, the second scan signal SC2 is at a high voltage level and the second transistor T2 is turned off.

During the at least one bias period Tobs1 and Tobs2, the third scan signal SC3(*n*) is at a low voltage level, and the fifth and sixth transistors T5 and T6 are turned on. As the fifth transistor T5 has been turned on, the bias voltage Vobs is applied to the first electrode of the driving transistor DT connected to the second node N2. For example, when the fifth transistor T5 has been turned on, the bias voltage Vobs is applied to the first electrode N2 of the driving transistor DT through the first metal line for supplying the bias voltage among the at least two or more first metal lines.

In this regard, the bias voltage Vobs is supplied to the third node N3 as the drain electrode of the driving transistor DT. Thus, in the light-emission period, a charging time or charging delay of the voltage of the fifth node N5 as the anode electrode of the light-emitting element EL may be reduced. The driving transistor DT is maintained at a stronger saturation state.

For example, as the bias voltage Vobs increases, the voltage of the third node N3 as the drain electrode of the driving transistor DT may increase, and a gate-source voltage or a drain-source voltage of the driving transistor DT may decrease. Therefore, it is desirable that the bias voltage Vobs is greater than the data voltage Vdata.

In this regard, a magnitude of the drain-source current Id flowing through the driving transistor DT may be reduced, and a stress of the driving transistor DT may be reduced in a positive bias stress situation, thereby resolving the charging delay of the voltage of the third node N3. In other words, a hysteresis of the driving transistor DT may be alleviated by performing an on-bias stress (OBS) operation thereon before sampling the threshold voltage Vth of the driving transistor DT.

Accordingly, during the at least one bias period Tobs1 and Tobs2, the OBS operation may be defined as an operation of directly applying an appropriate bias voltage to the driving transistor DT during non-emission periods.

Furthermore, during the at least one bias period Tobs1 and Tobs2, as the sixth transistor T6 has been turned on, the anode electrode (or pixel electrode) of the light-emitting element EL connected to the fifth node N5 is initialized with the anode reset voltage Var. For example, when the sixth transistor T6 has been turned on, the anode reset voltage Var may be applied to the anode electrode as the first electrode N5 of the light-emitting element EL through the first metal line for supplying the anode reset voltage among the at least two or more first metal lines. Therefore, the anode electrode N5 of the light-emitting element EL is reset with the anode reset voltage Var.

In this regard, the fifth and sixth transistors T5 and T6 may be configured such that the gate electrodes of the fifth and sixth transistors T5 and T6 receive separate scan signals and thus are independently controlled. That is, aspects of the present disclosure are not necessarily limited to a configuration that the bias voltage is simultaneously applied to the first electrode of the driving transistor DT and the anode electrode of the light-emitting element EL during the bias period.

Referring to FIG. 5, the refresh period of the pixel circuit may include the initialization period Ti. The initialization section Ti refers to a period for which the voltage of the gate electrode N1 of the driving transistor DT is initialized.

During the initialization period Ti, each of the first scan signal SC1(*n*) to the fourth scan signal SC4(*n*) and the light-emission control signal EM(n) is at a high voltage level, and the first transistor T1 and the seventh transistor T7 are turned on. The second to sixth transistors T2, T3, T4, T5, and T6 are turned off. As the first and seventh transistors T1 and T7 have been turned on, the gate electrode and the second electrode of the driving transistor DT connected to the first node N1 are initialized with the initialization voltage Vini. For example, when the first and seventh transistors T1 and T7 have been turned on, the initialization voltage Vini may be applied to the gate electrode of the driving transistor DT to connected to the first node N1 through the first metal line for supplying the initialization voltage among the at least two or more first metal lines. Accordingly, the gate electrode N1 and the second electrode N3 of the driving transistor DT are initialized with the initialization voltage Vini.

The display device 100 may further include the at least two scan lines GL that start to extend from the non-display area NA and extend in the row direction and are disposed adjacent to each other in the display area AA.

The fifth transistor T5 as a bias transistor, and the sixth transistor T6 as a reset transistor may be turned on based on the third scan signal SC3(*n*) applied thereto through the third scan line SC3 among the at least two scan lines GL. The seventh transistor T7 as an initialization transistor may be turned on based on the fourth scan signal SC4(*n*) applied thereto through the fourth scan line SC4 among the at least two scan lines GL.

Referring to FIG. 5, the refresh period of the pixel circuit may include the sampling period Ts. The sampling period Ts refers to a period for which the threshold voltage Vth of the driving transistor DT is sampled.

During the sampling period Ts, each of the first scan signal SC1(*n*), the third scan signal SC3(*n*), and the light-emission control signal EM(n) is at a high voltage level, and each of the second scan signal SC2(*n*) and the fourth scan signal SC4(*n*) is at a low voltage level. Accordingly, the third to seventh transistors T3, T4, T5, T6, and T7 may be turned off, the first transistor T1 may be maintained in a turned-on state, and the second transistor T2 may be turned on. That is, the second transistor T2 may be turned on, such that the data voltage Vdata may be applied to the driving transistor DT. The first transistor T1 may be connected in a diode manner to and disposed between the first node N1 and the third node N3 to sample the threshold voltage Vth of the driving transistor DT.

Referring to FIG. 5, the refresh period of the pixel circuit may include the light-emission period Te. The light-emission period Te refers to a period for which the sampled threshold voltage Vth is cancelled, and the light-emitting element EL emits light based on the driving current corresponding to the sampled data voltage.

During the light-emission period Te, the light-emission control signal EM(n) is at a low voltage level, and the third and fourth transistors T3 and T4 are turned on.

As the third transistor T3 has been turned on, the high potential driving voltage EVDD connected to the fourth node N4 is applied to the first electrode of the driving transistor DT connected to the second node N2 through the third transistor T3. The driving current Id supplied from the driving transistor DT to the light-emitting element EL through the fourth transistor T4 is independent of a value of the threshold voltage Vth of the driving transistor DT, such that the threshold voltage Vth of the driving transistor DT is compensated for.

Next, referring to FIG. 6, an operation of each of the pixel circuit and the light-emitting element during the hold period is described.

The hold period may include at least one bias period Tobs3 and Tobs4 and a light-emission period Te'. The description of the operation of the pixel circuit during the hold period that is the same as the operation of the pixel circuit during the refresh period will be omitted.

As mentioned above, during the refresh period, a new data voltage Vdata is charged and the new data voltage Vdata is applied to the gate electrode of the driving transistor DT, while during the hold period, the data voltage Vdata of the refresh period is maintained. Therefore, unlike the refresh period, the hold period does not require the initialization period Ti or the sampling period Ts.

It may suffice that a single OBS operation is performed for the hold period. However, in this aspect, for the convenience of the driving circuit, the third scan signal SC3 (*n*) is applied during the hold period in an identical manner to the application of the third scan signal SC3(*n*) during the refresh period, and as a result, the OBS operation may be performed twice in the refresh period.

A difference between the driving signal during the refresh period as described with reference to FIG. 5 and the driving signal during the hold period in FIG. 6 is about the second and fourth scan signals SC2(*n*) and SC4(*n*). During the hold period, the initialization period Ti and the sampling period Ts are unnecessary, unlike the refresh period. Thus, during the hold period, the second scan signal SC2(*n*) is always at a high voltage level, and the fourth scan signal SC4(*n*) is always at a low voltage level. That is, the second and seventh transistors T2 and T7 are always turned off.

Figure 7:
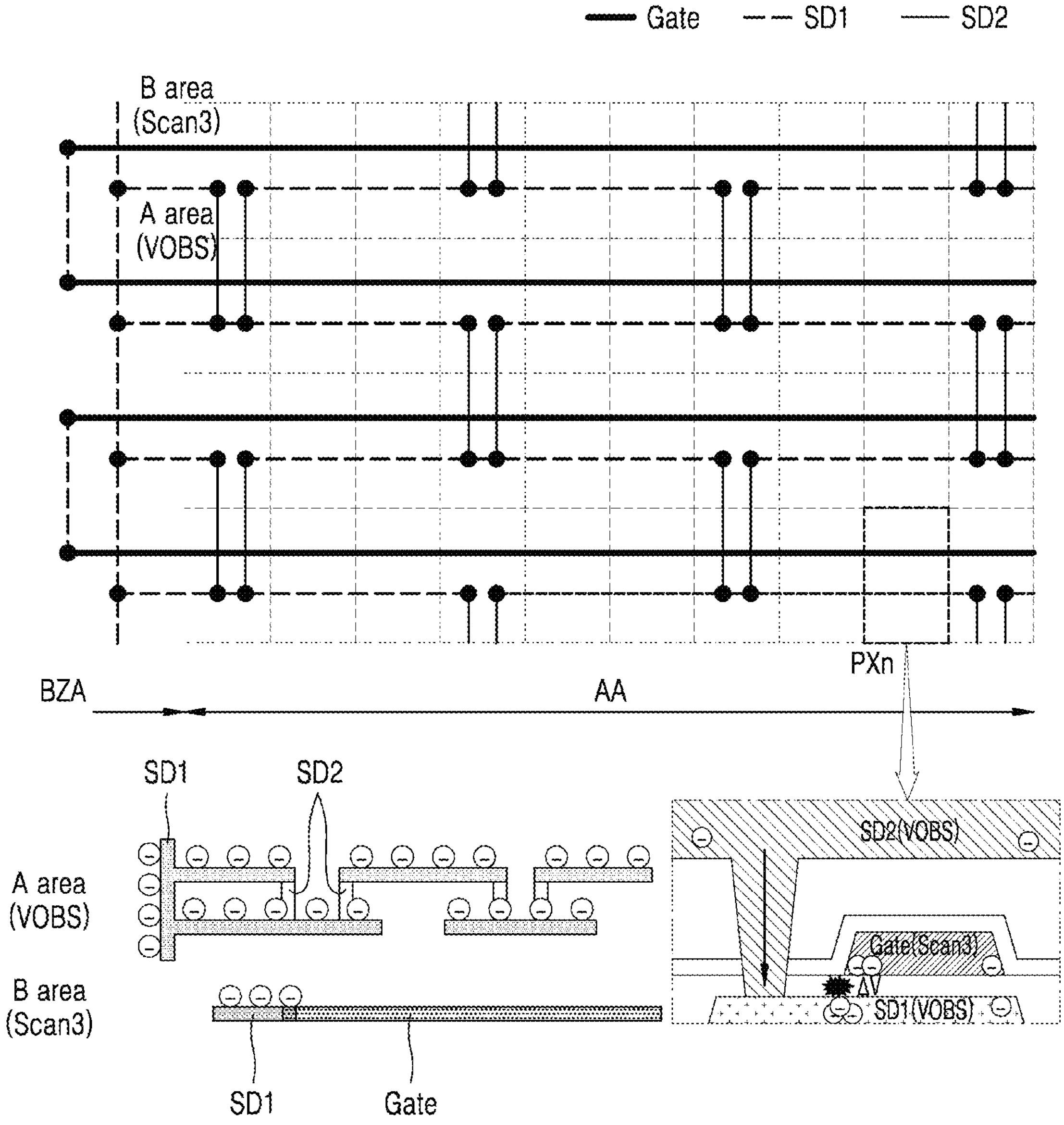
FIG. 7 is a diagram showing an arrangement structure of a bias voltage supply line and a scan signal supply line according to an aspect of the present disclosure.
Figure 8:
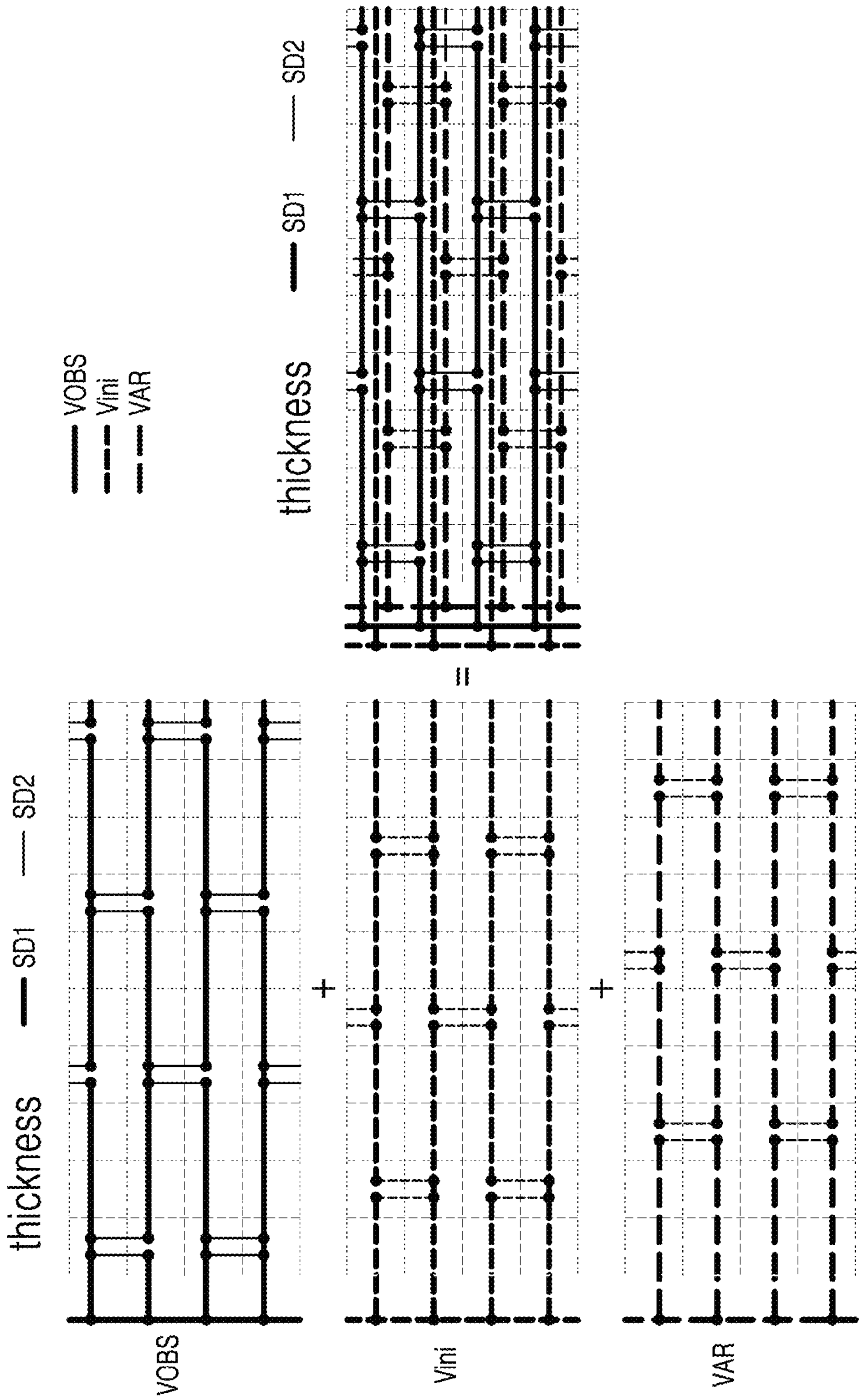
FIG. 8 is a diagram showing a connection structure of SD1 and SD2 lines for supply of a bias voltage, an initialization voltage, and an anode reset voltage according to an aspect of the present disclosure.
Figure 9:
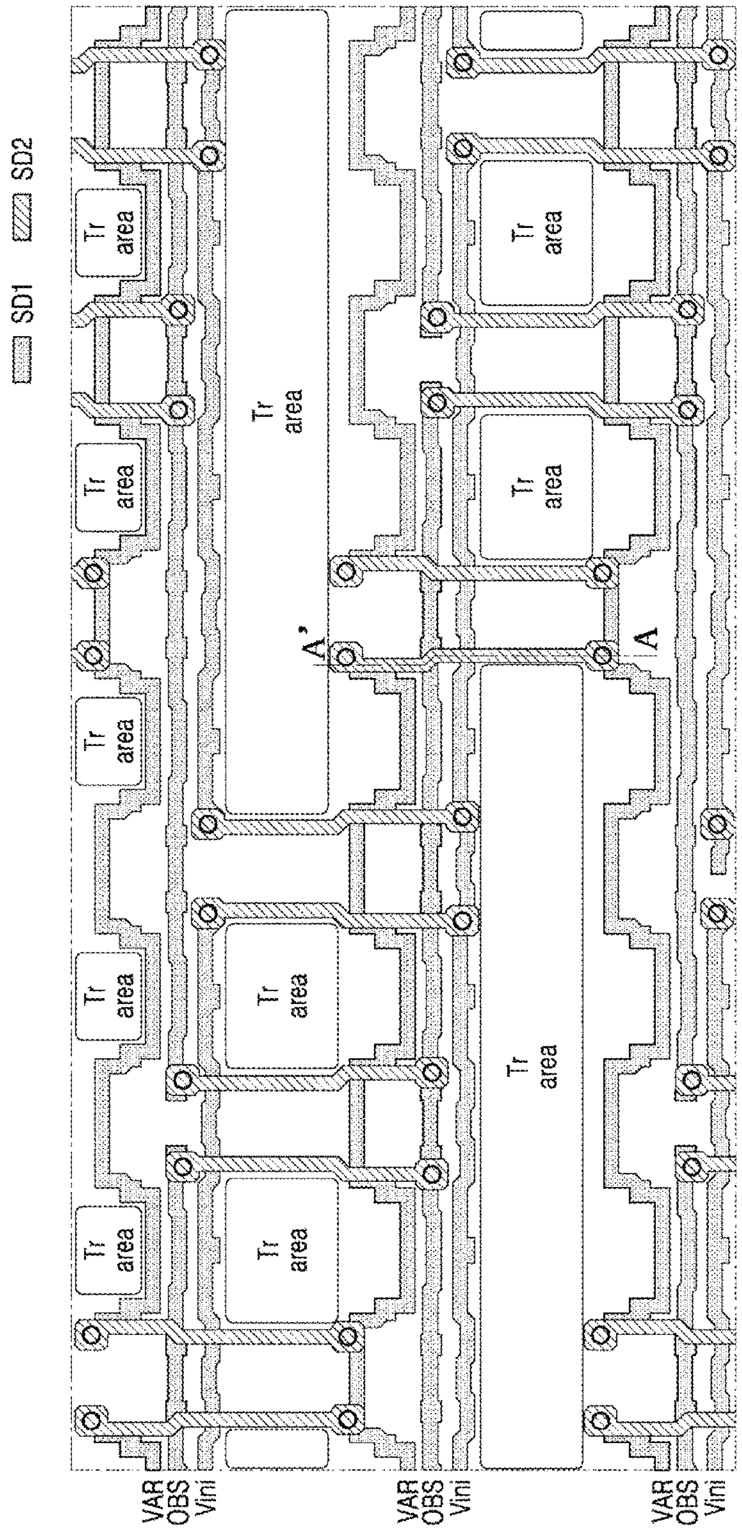
FIG. 9 is a diagram showing an actual implementation example of SD1 and SD2 lines for supply of VAR, VOBS, and Vini according to an aspect of the present disclosure.

FIG. 7 is a diagram showing an arrangement structure of a bias voltage supply line and a scan signal supply line according to an aspect of the present disclosure. FIG. 8 is a diagram showing a connection structure of SD1 and SD2 lines for supply of a bias voltage, an initialization voltage, and an anode reset voltage according to an aspect of the present disclosure. FIG. 9 is a diagram showing an example of SD1 and SD2 lines for supply of VAR, VOBS, and Vini according to an aspect of the present disclosure.

Referring to FIG. 7, the display panel 10 according to an aspect of the present disclosure may include the display area AA and the non-display area NA. The non-display area NA may include a bezel area BZA.

Furthermore, the display panel 10 may include at least two or more first metal lines SD1 and at least two or more second metal lines SD2.

The at least two or more first metal lines SD1 may start to extend from the non-display area NA and BZA and extend in the row direction to the display area AA. The at least two first metal lines SD1 may be arranged to be adjacent to each other. Each of the at least two first metal lines SD1 may be broken into broken portions separated from each other by a predetermined spacing.

The at least two or more second metal lines SD2 may be disposed in a layer different from a layer in which at least two or more first metal lines SD1 are disposed. Each of the at least two or more second metal lines SD2 may extend from a first point overlapping an end of the broken portions of one first metal line SD1 to a second point overlapping another first metal line SD1 spaced from one first metal line SD1 in the column direction.

A first contact hole may be positioned at the first point may extend vertically to connect one first metal line SD1 and the corresponding second metal line SD2 to each other. A second contact hole may be positioned at the second point may extend vertically to connect another first metal line SD1 and the corresponding second metal line SD2 to each other. One side of the corresponding second metal line SD2 is connected to the one first metal line SD1 via a connection line of the first contact hole at the first point. The other side of the corresponding second metal line SD2 is connected to the another first metal line SD1 via a connection line of the second contact hole at the second point. In this way, in a plan view, the at least two or more first metal lines SD1 and the at least two or more second metal lines SD2 may constitute a mesh structure.

Each of the at least two or more first and second metal lines SD1 and SD2 may be made of any one or an alloy of two or more of molybdenum (Mo), aluminum (Al), chromium (Cr), gold (Au), titanium (Ti), nickel (Ni), neodymium (Nd), and copper (Cu).

The display panel 10 may further include the at least two or more gate lines Gate that are spaced from each other in the column direction and start to extend from the non-display area NA and BZA and further extend in the row direction into the display area AA.

Each of the at least two or more gate line gates may be made of any one or an alloy of two or more of magnesium (Mg), molybdenum (Mo), aluminum (Al), chromium (Cr), gold (Au), titanium (Ti), nickel (Ni), neodymium (Nd), and copper (Cu).

Referring to FIG. 8, each of at least two or more first metal lines SD1 may be the bias voltage line VOBS for supplying the bias voltage Vobs to the display panel 10.

Thus, when each of the at least two or more first metal lines SD1 acts as the bias voltage line VOBS, one first metal line SD1 and another first metal line SD1 spaced from one first metal line SD1 in the column direction may be connected to each other via the corresponding second metal line SD2 and the first and second contact holes.

Each of the at least two or more first metal lines SD1 may be the initialization voltage line Vini for supplying the initialization voltage Vini to the display panel 10.

Thus, when each of the at least two or more first metal lines SD1 acts as the initialization voltage line Vini, one first metal line SD1 and another first metal line SD1 spaced from one first metal line SD1 in the column direction may be connected to each other via the corresponding second metal line SD2 and the first and second contact holes.

Each of the at least two or more first metal lines SD1 may be the anode reset voltage line VAR for supplying the anode reset voltage Var to the display panel 10.

Thus, when each of the at least two or more first metal lines SD1 acts as the anode reset voltage line VAR, one first metal line SD1 and another first metal line SD1 spaced from one first metal line SD1 in the column direction may be connected to each other via the corresponding second metal line SD2 and the first and second contact holes.

As shown in FIG. 8, some of the at least two first metal lines SD1 disposed in the display panel 10 may act as the bias voltage line VOBS, further some may act as the initialization voltage line Vini, and still further some thereof may act as the anode reset voltage line VAR. In this regard, two bias voltage lines VOBS spaced from each other in the column direction may be connected to each other via the corresponding second metal line SD2 and the first and second contact holes. Thus, the bias voltage lines VOBS and the second metal lines SD2 may constitute the mesh structure in the plan view of the display panel 10. Further, two initialization voltage lines Vini spaced from each other in the column direction may be connected to each other via the corresponding second metal line SD2 and the first and second contact holes. Thus, the initialization voltage lines Vini and the second metal lines SD2 may constitute the mesh structure in the plan view of the display panel 10. Further, two anode reset voltage lines VAR spaced from each other in the column direction may be connected to each other via the corresponding second metal line SD2 and the first and second contact holes. Thus, the anode reset voltage lines VAR and the second metal lines SD2 may constitute the mesh structure in the plan view of the display panel 10.

Referring to FIG. 7, the first metal line SD1 acts as the bias voltage line VOBS in the display panel 10 (A area). Thus, even when charges are accumulated in the pixel PXn spaced from each other in the column direction and may be connected to each other via the corresponding second metal line SD2 and the first and second contact holes. The initialization voltage lines *Vini* may be spaced from each other in the column direction and may be connected to each other via the corresponding second metal line SD2 and the first and second contact holes. The anode reset voltage lines VAR may be spaced from each other in the column direction and may be connected to each other via the corresponding second metal line SD2 and the first and second contact holes.

In this regard, a capacitance value between the bias voltage line VOBS and each of nodes adjacent thereto increases as shown in Table 1 below. However, the capacitance value relative to the DC voltage increases, such that the increase does not have a significant effect on the panel characteristics.

TABLE 1

| Green Cpara (IF) | VDD | Vini | OBS | Vdata_G | Scan1_T | Scan1_B | Scan2 | Scan3 | Scan4_T |
|---|---|---|---|---|---|---|---|---|---|
| Vini | 1.25 | | | | | | | | |
| OBS | 0.93 | 0.91 | | | | | | | |
| Vdata_G | 0.50 | 0.28 | 0.37 | | | | | | |
| Scan1_T | 0.55 | 0.00 | 0.00 | 0.10 | | | | | |
| Scan1_B | 1.05 | 0.01 | 0.01 | 0.02 | 6.31 | | | | |
| Scan2 | 1.17 | 0.02 | 0.02 | 1.02 | 0.10 | 0.40 | | | |
| Scan3 | 1.05 | 2.40 | 1.58 | 0.10 | 0.00 | 0.01 | 0.02 | | |
| Scan4_T | 0.22 | 0.29 | 0.70 | 1.31 | 0.00 | 0.00 | 0.05 | 0.03 | |
| Scan4_B | 0.86 | 0.63 | 0.46 | 0.31 | 0.00 | 0.02 | 0.25 | 0.08 | 6.33 |
| EM | 3.32 | 0.04 | 0.01 | 0.06 | 0.00 | 0.01 | 0.01 | 0.00 | 0.00 |
| node1_G | 8.32 | 0.68 | 0.03 | 0.68 | 0.51 | 1.82 | 0.62 | 0.01 | 0.00 |
| node2_G | 61.66 | 0.00 | 0.00 | 0.01 | 1.39 | 0.77 | 3.18 | 0.00 | 0.30 |
| node3_G | 2.99 | 0.01 | 0.00 | 0.00 | 0.37 | 0.78 | 0.02 | 0.00 | 0.00 |
| node4_G | 9.65 | 1.44 | 0.23 | 0.01 | 0.00 | 0.00 | 0.00 | 0.00 | 0.00 |
| VAR | 2.17 | 0.19 | 0.66 | 0.74 | 2.30 | 0.32 | 1.52 | 0.51 | 3.14 |
| VSS | 2.57 | 0.28 | 0.19 | 1.41 | 0.04 | 0.04 | 0.08 | 0.16 | 0.11 |

| Green Cpara (IF) | Scan4_B | EM | node1_G | node2_G | node3_G | node4_G | VAR |
|---|---|---|---|---|---|---|---|
| Vini | | | | | | | |
| OBS | | | | | | | |
| Vdata_G | | | | | | | |
| Scan1_T | | | | | | | |
| Scan1_B | | | | | | | |
| Scan2 | | | | | | | |
| Scan3 | | | | | | | |
| Scan4_T | | | | | | | |
| Scan4_B | | | | | | | |
| EM | 0.00 | | | | | | |
| node1_G | 0.01 | 1.40 | | | | | |
| node2_G | 0.62 | 0.01 | 0.36 | | | | |
| node3_G | 0.01 | 0.54 | 0.01 | 0.31 | | | |
| node4_G | 0.00 | 0.98 | 0.16 | 0.00 | 0.02 | | |
| VAR | 1.65 | 0.06 | 0.95 | 0.59 | 0.01 | 0.40 | |
| VSS | 0.06 | 0.04 | 0.02 | 0.07 | 0.04 | 58.98 | 1.21 |

vulnerable to the etching after dry etching of the first metal line SD1, an amount of charges accumulated on the first metal line SD1 decreases because the first metal line SD1 is broken into the portions spaced from each other.

In this regard, the third gate line Scan3 for supplying the third scan signal Scan3(*n*) is disposed between neighboring first metal lines SD1 for supplying the bias voltage (B area). However, the third gate line Scan3 is less affected by the first metal lines SD1. This is because the charges flowing along the first metal line SD1 are dispersed along the broken portions of the first metal lines SD1 spaced from each other.

Referring to FIG. 9, the bias voltage lines VOBS, the initialization voltage lines Vini, and the anode reset voltage lines VAR embodied as the first metal lines SD1 may extend in the row direction. The bias voltage lines VOBS may be In FIG. 9, each of the bias voltage line VOBS, the initialization voltage line Vini, and the anode reset voltage line VAR do not overlap a transistor Tr area.

In this regard, both opposing ends of the second metal line SD2 disposed in a different layer from a layer of the first metal line SD1 and extending in the column direction may be connected to two first metal lines SD1 spaced from each other in the column direction via two contact holes, respectively.

Figure 10:
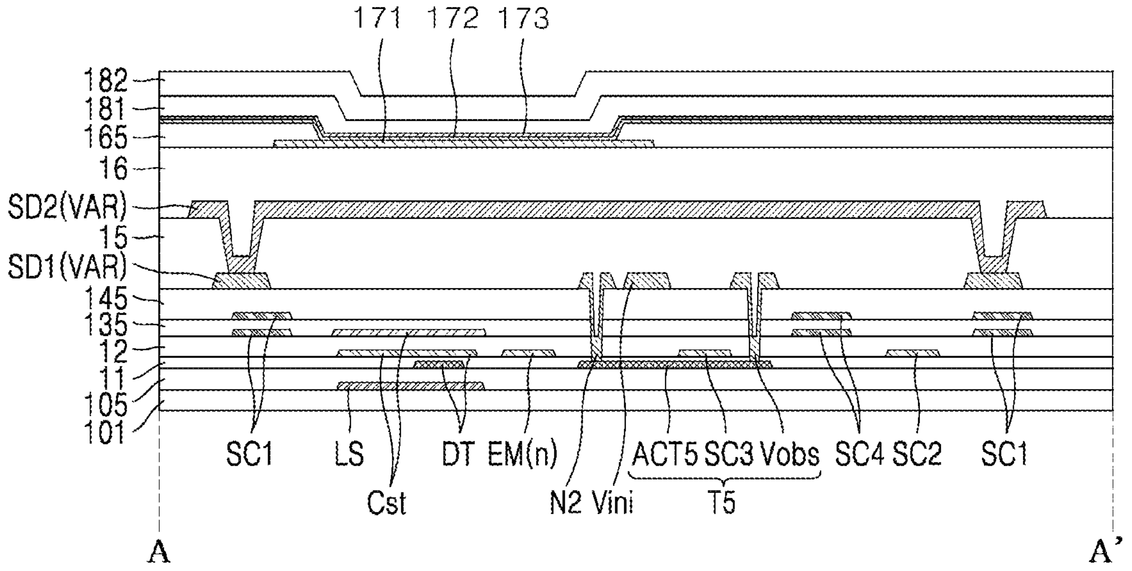
FIG. 10 is a cross-sectional view showing a connection structure of SD1 and SD2 lines for supply of VAR according to an aspect of the present disclosure.

FIG. 10 is a cross-sectional view showing a structure in which the SD1 and SD2 lines for VAR are connected to each other, according to an aspect of the present disclosure. That is, FIG. 10 is a cross-sectional view showing a cross-section of the second metal line SD2 in FIG. 9 as cut along a cutting line A-A' in a column direction.

Referring to FIG. 10, in the display panel 10 according to an aspect of the present disclosure, two first metal lines SD1 (VAR) for supplying the bias voltage that are adjacent to each other among the at least two first metal lines are separated from each other by an predetermined spacing and may be disposed on the protective film 145.

Furthermore, the first middle layer 15 for planarization may be disposed on the two first metal lines SD1 (VAR) and the protective film 145. The second metal line SD2 (VAR) for bias voltage supply may be disposed on the first middle layer 15 and may extended by a length equal to the spacing between the two first metal lines SD1 (VAR) for supplying the bias voltage.

In this case, one end and the other end of the second metal line SD2 (VAR) for supplying the bias voltage may be electrically connected to the two first metal lines SD1 (VAR) for supplying the bias voltage via two contact holes extending through the first middle layer 15, respectively.

As shown in FIG. 10, the display panel 10 according to an aspect of the present disclosure includes the buffer layer 105 disposed on the substrate 101. One electrode of the driving transistor DT, and an active layer ACT5 of the fifth transistor T5 may be disposed on the buffer layer 105.

Furthermore, the first insulating layer 11 may be disposed on one electrode of the driving transistor DT, and the active layer ACT5 of the fifth transistor T5. One electrode of the storage capacitor Cst, the light-emission control signal line EM(n), the third scan line SC3 and the second scan line SC2 may be disposed on the first insulating layer 11.

In this regard, a light shield layer LS may be provided on the substrate 101 in an area overlapping with the first electrode of the storage capacitor Cst and the first electrode of the driving transistor DT.

Furthermore, the second insulating layer 12 may be disposed on one electrode of the storage capacitor Cst, the light-emission control signal line EM(n), the third scan line SC3 and the second scan line SC2. One side (1-1)-th scan line SC1, the other electrode of the storage capacitor Cst, one-side fourth scan line SC4, and one-side (1-2)-th scan line SC1 may be disposed on the second insulating layer 12.

Furthermore, the third insulating layer 135 may be disposed on one-side (1-1)-th scan line SC1, the other electrode of the storage capacitor Cst, one-side fourth scan line SC4, and one-side (1-2)-th scan line SC1. The other side (1-1)-th scan line SC1, the other-side fourth scan line SC4, and the other-side (1-2)-th scan line SC1 may be disposed on the third insulating layer 135.

Furthermore, the protective film 145 may be disposed on the other-side (1-1)-th scan line SC1, the other-side fourth scan line SC4, and the other-side (1-2)-th scan line SC1. The two first metal lines SD1 for suppling the bias voltage spaced from each other by the predetermined spacing may be disposed on the protective film 145.

Furthermore, the first middle layer 15 for planarization may be disposed on the two first metal lines SD1 (VAR) for supplying the bias voltage and the protective film 145. The second metal line SD2 (VAR) for supplying the bias voltage having the length equal to the spacing between the two first metal lines SD1 (VAR) for supplying the bias voltage may be disposed on the first middle layer 15.

In this regard, one end and the other end of the second metal line SD2 (VAR) for supplying the bias voltage may be electrically connected to the two first metal lines SD1 (VAR) for supplying the bias voltage via two contact holes extending through the first middle layer 15, respectively.

Furthermore, the display panel 10 may include a plurality of sub-pixels arranged in the display area AA, each sub-pixel including one or more transistors, as shown in FIG. 3 and FIG. 10.

One of the plurality of sub-pixels may include, for example, the light-emitting element EL connected to the fourth transistor T4, the encapsulation layer 18 disposed on the light-emitting element EL, the plurality of touch electrodes 195 and 196 disposed on the encapsulation layer 18 in the display area AA, and the touch protective film 197 disposed on the plurality of touch electrodes 195 and 196.

The encapsulation layer 18 may include an insulating organic material.

The insulating organic material may include one or more of benzocyclobutene (BCB), acryl resin, epoxy resin, phenolic resin, polyamide resin, or polyimide resin.

The encapsulation layer 18 may include the first encapsulation layer 181 disposed on the light-emitting element EL, the second encapsulation layer 182 disposed on the first encapsulation layer 181, and the third encapsulation layer 183 disposed on the second encapsulation layer 182.

The plurality of touch electrodes 195 and 196 may include the first touch electrode 195 and the second touch electrode 196.

The touch buffer film 191 may be disposed on the encapsulation layer 18. The first touch connection electrode 192 may be disposed on the touch buffer film 191. The touch insulating film 193 may be disposed on the touch buffer film 191 and the first touch connection electrode 192. The first touch electrode 195, the second touch electrode 196, and the second touch connection electrode 194 may be disposed on the touch insulating film 193.

The first touch electrode 195 and the second touch electrode 196 may be connected to the first touch connection electrode 192 via two contact holes extending through the touch insulating film 193, respectively.

As shown in FIG. 2 according to the present disclosure, the first transistor T1 may be electrically connected and disposed between the gate electrode N1 and the source electrode N3 of the driving transistor DT.

That is, one electrode N1 of the first transistor T1 may be connected to the first node N1 as the gate electrode of the driving transistor DT, while the other electrode N3 of the first transistor T1 may be contacted to the third node N3 as the source electrode of the driving transistor DT.

In this regard, the first transistor T1 is turned on based on the first scan signal SC1(*n*) to control the difference (gate-source voltage: Vgs) between a voltage level of the gate node and a voltage level of the source node of the driving transistor DT.

Therefore, the Vgs under a main stress condition of PBTS (Positive Bias Temperature Stress) may be reduced from a difference between the gate-off signal VGH and the initialization signal Vini to a difference between the gate-off signal VGH and the gate voltage Vg (previous frame voltage) of the driving transistor DT.

The first transistor T1 may adjust the gate voltage Vg of the driving transistor DT to the previous frame voltage, such that the PBTS may be reduced.

According to the present disclosure, the first transistor T1 adjusts the gate voltage Vg of the driving transistor DT to the previous frame voltage, such that a current value of the light-emitting element EL may be improved compared to that of a conventional pixel.

Therefore, when operating the display device 100, a voltage difference is not generated between the high voltage of the first scan signal Scan 1 and the gate voltage Vg of the driving transistor. Therefore, the oxide thin-film transistor for sampling is not subjected to the PBTS.

Accordingly, the threshold voltage Vth of the transistor may be prevented from being positively shifted, and kick-back may be reduced to prevent a low-gray level stain of the pixel due to decrease in the current and luminance.

The first thin-film transistor T1 as the low-temperature polycrystalline silicon (LTPS) may be disposed between and connected to the gate electrode and the source electrode of the driving transistor, such that the voltage difference between the gate-off signal and the initialization signal that causes the bias stress may be reduced to the voltage difference between the gate-off signal and the previous frame voltage.

Therefore, the kickback caused by the bias stress of the driving transistor may be reduced such that an amount of shift of the oxide transistor may be reduced, and thus, the occurrence of the low-gray level stain in the pixel may be prevented.

In addition, the occurrence of the low-gray level stain may be suppressed, such that the quality of the product may be improved, and the reliability thereof may be secured, thus making it possible to realize a narrow bezel.

As described above, according to an aspect of the present disclosure, a first source-drain metal line disposed in the display panel may be broken into the portions spaced from each other by the predetermined spacing. Neighboring first source-drain metal lines may be connected to each other via the second source-drain metal line. In this regard, the first source-drain metal line disposed in the display panel may supply the power signal VOBS, Vini, or VAR. Because the first source-drain metal line is broken into the short portions, the difference between the charge amount on the gate line and the change amount on the first source-drain metal line from may be prevented from increasing. Thus, a display device may be realized in which the thin-film transistor of each pixel is robust against leakage.

Further, according to an aspect of the present disclosure, the first source-drain metal line disposed in the display panel may be broken into the portions spaced from each other by the predetermined spacing. The at least two second source-drain metal lines may be disposed in a layer different from a layer in which the at least two first source-drain metal lines are disposed, wherein each of the at least two second source-drain metal lines extends in the column direction from a first point vertically overlapping an end of each of the broken portions of one first source-drain metal line to a second point vertically overlapping a point of each of the broken portions of another first source-drain metal line spaced from the one first metal line in the column direction, wherein the first contact hole is positioned at the first point extends vertically to connect the one first source-drain metal line and the corresponding second source-drain metal line to each other, wherein the second contact hole is positioned at the second point extends vertically to connect the another first source-drain metal line and the corresponding second source-drain metal line to each other, such that the one first source-drain metal line and the another first source-drain metal line spaced from each other in the column direction are connected to each other via the corresponding second source-drain metal line and the first and second contact holes, wherein in a plan view of the display device, the at least two first source-drain metal lines and the at least two second source-drain metal lines constitute a mesh structure.

Although embodiments of the present disclosure have been described with reference to the accompanying drawings, the present disclosure is not limited to the above embodiments, but may be implemented in various different forms. A person skilled in the art may appreciate that the present disclosure may be practiced in other concrete forms without changing the technical spirit or essential characteristics of the present disclosure. Therefore, it should be appreciated that the embodiments as described above is not restrictive but illustrative in all respects.

The invention claimed is:

1. A display device comprising:

a display panel including a display area and a non-display area;

first metal lines in a first layer starting to extend from the non-display area and extending lengthwise in a row direction into the display area, wherein the first metal lines are spaced apart from each other in a column direction, and each of the first metal lines is disconnected lengthwise into portions that are separated from each other in the row direction by a first predetermined spacing; and second metal lines disposed in a second layer, wherein each of the second metal lines extends lengthwise in the column direction from a first point overlapping an end of the portions of one first metal line to a second point overlapping another first metal line that is spaced apart from the one first metal line in the column direction, wherein a first contact hole is positioned at the first point and connects the one first metal line and the corresponding second metal line to each other, wherein a second contact hole is positioned at the second point and connects the another first metal line and the corresponding second metal line to each other, wherein one side of the corresponding second metal line is connected to the one first metal line via a connection line of the first contact hole at the first point, wherein another side of the corresponding second metal line is connected to the another first metal line via a connection line of the second contact hole at the second point, wherein in a plan view of the display device, the first metal lines and the second metal lines form a mesh structure, wherein the display panel includes:

two adjacent first metal lines for supplying a bias voltage disposed on a protective film and separated from each other by a predetermined spacing;

a first middle layer for planarization disposed on the two adjacent first metal lines;

the second metal line for supplying the bias voltage disposed on the first middle layer, wherein the second metal line has a length equal to the predetermined spacing between the two adjacent first metal lines, wherein both opposing ends of the second metal line in a length direction pass through the first middle layer and are electrically connected to the two adjacent first metal lines via two contact holes, and a gate line for supplying a scan signal, wherein the gate line extends lengthwise parallel to the first metal lines and is disposed between the two adjacent first metal lines that supply the bias voltage.

2. The display device of claim 1, wherein each of the first metal lines and the second metal lines comprises one or an alloy of two or more of molybdenum (Mo), aluminum (Al), chromium (Cr), gold (Au), titanium (Ti), nickel (Ni), neodymium (Nd), and copper (Cu).

3. The display device of claim 1, wherein the gate line is one of a plurality of gate lines spaced from each other in the column direction and starting to extend from the non-display area and extending lengthwise in the row direction into the display area.

4. The display device of claim 3, wherein the non-display area includes a bezel area disposed on a front surface of the display panel.

5. The display device of claim 3, wherein each of the gate lines is made of one or an alloy of two or more of magnesium (Mg), molybdenum (Mo), aluminum (Al), chromium (Cr), gold (Au), titanium (Ti), nickel (Ni), neodymium (Nd), and copper (Cu).

6. The display device of claim 1, wherein each of the first metal lines is configured to supply a bias voltage to the display panel.

7. The display device of claim 1, wherein at least one of the first metal lines is configured to supply an initialization voltage to the display panel.

8. The display device of claim 1, wherein at least one of the first metal lines is configured to supply an anode reset voltage to the display panel.

9. The display device of claim 1, wherein the first metal lines comprises a first line configured to supply a bias voltage, a second line configured to provide an initialization voltage, and a third line configured to supply an anode reset voltage.

10. The display device of claim 1, wherein the first metal lines includes two adjacent first metal lines for supplying a bias voltage disposed on a protective film and separated from each other by a predetermined spacing, wherein a first middle layer for planarization is disposed on the two adjacent first metal lines and the protective film, wherein a second metal line is configured to supply the bias voltage and has a length equal to the predetermined spacing between the two adjacent first metal lines, wherein the second metal line is disposed on the first middle layer, wherein both opposing ends in a length direction of the second metal line pass through the first middle layer and are electrically connected to the two adjacent first metal lines for supplying the bias voltage via two contact holes.

11. The display device of claim 1, wherein the display panel further includes:

a substrate:

a buffer layer disposed on the substrate;

a first electrode of a driving transistor and an active layer of a bias transistor disposed on the buffer layer;

a first insulating layer disposed on the first electrode;

a second electrode of a storage capacitor, a light-emission signal line, a second scan line, and a third scan line disposed on the first insulating layer;

a second insulating layer disposed on the first electrode, the light-emission signal line, the second scan line, and the third scan line;

one-side (1-1)-th scan line, a third electrode of the storage capacitor, one-side fourth scan line, and one-side (1-2)-th scan line disposed on the second insulating layer;

a third insulating layer disposed on the one-side (1-1)-th scan line, the third electrode of the storage capacitor, the one-side fourth scan line, and the one-side (1-2)-th scan line;

the other-side (1-1)-th scan line, the other-side fourth scan line, and the other-side (1-2)-th scan line disposed on the third insulating layer; and the protective film disposed on the other-side (1-1)-th scan line, the other-side fourth scan line, and the other-side (1-2)-th scan line.

12. The display device of claim 1, wherein the display panel includes a plurality of sub-pixels disposed in the display area, and each of sub-pixel including one or more transistors, wherein each of the plurality of sub-pixels includes:

a light-emitting element connected to the one or more transistors;

an encapsulation layer disposed on the light-emitting element;

a plurality of touch electrodes disposed on the encapsulation layer in the display area; and a touch protective film disposed on the plurality of touch electrodes.

13. The display device of claim 12, wherein the encapsulation layer includes an insulating organic material.

14. The display device of claim 13, wherein the insulating organic material includes at least one of benzocyclobutene, acrylic resin, epoxy resin, phenol resin, polyamide resin, or polyimide resin.

15. The display device of claim 12, wherein the encapsulation layer includes:

a first encapsulation layer disposed on the light-emitting element;

a second encapsulation layer disposed on the first encapsulation layer; and a third encapsulation layer disposed on the second encapsulation layer.

16. The display device of claim 12, wherein the plurality of touch electrodes include a first touch electrode and a second touch electrode.

17. The display device of claim 16, wherein a touch buffer film is disposed on the encapsulation layer, wherein a first touch connection electrode is disposed on the touch buffer film, wherein a touch insulating film is disposed on the touch buffer film and the first touch connection electrode, wherein the first touch electrode, the second touch electrode, and a second touch connection electrode are disposed on the touch insulating film, wherein the first touch electrode and the second touch electrode are connected to the first touch connection electrode via two contact holes extending pass through the touch insulating film, respectively.

18. A display device comprising:

a display panel including a display area and a non-display area;

at least two or more first metal lines starting to extend from the non-display area and extending in a row direction into the display area, wherein the at least two or more first metal lines are arranged so as to be spaced from each other in a column direction, and each of the at least two or more first metal lines is broken into broken portions spaced from each other in the row direction by a predetermined spacing;

at least two or more second metal lines disposed in a layer different from a layer in which the at least two or more first metal lines are disposed, wherein each of the at least two or more second metal lines extends in the column direction from a first point overlapping an end of the broken portions of one first metal line to a second point overlapping another first metal line spaced from the one first metal line in the column direction;

a light-emission driver configured to supply light-emission control signals to the display panel through gate metal lines;

a gate driver configured to supply gate signals to the display panel through the gate metal lines;

a data driver configured to supply a data voltage to the display panel; and a controller configured to control the gate driver and the data driver, wherein a first contact hole is positioned at the first point extends vertically so as to connect the one first metal line and the corresponding second metal line to each other, wherein a second contact hole is positioned at the second point extends vertically so as to connect the another first metal line and the corresponding second metal line to each other, wherein one side of the corresponding second metal line is connected to the one first metal line via a connection line of the first contact hole at the first point, wherein the other side of the corresponding second metal line is connected to the another first metal line via a connection line of the second contact hole at the second point, wherein in a plan view of the display device, the at least two or more first metal lines and the at least two or more second metal lines constitute a mesh structure, wherein a bias voltage, an initialization voltage, and an anode reset voltage are supplied to the display panel through the at least two first metal lines and the at least two second metal lines connected to each other, wherein the display panel includes:

two adjacent first metal lines for supplying a bias voltage disposed on a protective film and separated from each other by a predetermined spacing;

a first middle layer for planarization disposed on the two adjacent first metal lines; and the second metal line for supplying the bias voltage disposed on the first middle layer, wherein the second metal line has a length equal to the predetermined spacing between the two adjacent first metal lines, wherein both opposing ends of the second metal line in a length direction pass through the first middle layer and are electrically connected to the two adjacent first metal lines via two contact holes, wherein the gate metal lines include a gate metal line that is configured to supply a scan signal, wherein the gate metal line extends lengthwise parallel to the at least two or more first metal lines and is disposed between the two adjacent first metal lines that supply the bias voltage.

19. The display device of claim 18, wherein the display panel includes:

a light-emitting element including a first electrode as a fifth node, and a second electrode connected to a low potential driving voltage;

a driving transistor including a second electrode connected to a third node, a first electrode connected to a second node, and a gate electrode connected to a first node;

a first transistor including a first electrode connected to the third node, a second electrode connected to the first node, and a first gate electrode receiving a first scan signal;

a fifth transistor including a second electrode connected to the second node, a first electrode receiving a bias voltage, and a fifth gate electrode receiving a third scan signal;

a sixth transistor including a second electrode connected to the fifth node, a first electrode receiving an anode reset voltage, and a sixth gate electrode receiving the third scan signal;

a seventh transistor including a second electrode connected to the first node, a first electrode receiving an initialization voltage, and a seventh gate electrode receiving a fourth scan signal; and a storage capacitor connecting the first node and a fourth node to each other.

20. The display device of claim 19, wherein the display panel further includes:

a second transistor including a second electrode connected to the second node, a first electrode receiving a data voltage, and a second gate electrode receiving a second scan signal;

a third transistor including a second electrode connected to the second node, a first electrode connected to the fourth node to receive a high potential driving voltage therefrom, and a third gate electrode to receive a light-emission control signal; and a fourth transistor including a first electrode connected to the third node, a second electrode connected to the fifth node, and a fourth gate electrode connected to a light-emission signal line.

21. The display device of claim 19, wherein when the fifth transistor has been turned on, the bias voltage is applied to the driving transistor through a first metal line for supplying the bias voltage among the at least two or more first metal lines.

22. The display device of claim 19, wherein when the sixth transistor has been turned on, the anode reset voltage is applied to an anode electrode as the first electrode of the light-emitting element through a first metal line for supplying the anode reset voltage among the at least two or more first metal lines.

23. The display device of claim 19, wherein when the first transistor and the seventh transistor have been turned on, the initialization voltage is applied to the gate electrode of the driving transistor connected to the first node through a first metal line for supplying the initialization voltage among the at least two or more first metal lines.

24. The display device of claim 19, wherein the display device further comprises at least two or more scan lines spaced from each other and starting to extend from the non-display area and extending in a row direction into the display area, wherein the at least two or more scan lines include the gate metal line that is disposed between the two adjacent first metal lines.

25. The display device of claim 24, wherein the fifth transistor and the sixth transistor are turned on based on a third scan signal applied thereto through a third scan line among the at least two or more scan lines, wherein the seventh transistor is turned on based on a fourth scan signal applied thereto through a fourth scan line among the at least two or more scan lines.

26. A display device comprising:

a display panel including a display area and a non-display area;

a pair of first fragmented metal lines disposed in a first layer extending from the non-display area into the display area, wherein each first fragmented metal line among the pair of first fragmented metal lines is disconnected lengthwise at different locations along the row direction;

connecting lines disposed in a second layer extending from the non-display area into the display area and connecting the pair of first fragmented metal lines to each other, wherein the connecting lines are separated from each other in the row direction by a predetermined spacing; and a plurality of contact holes connecting the pair of first fragmented metal lines to the connecting lines, wherein the pair of first fragmented metal lines and the connecting lines form a mesh structure in a plan view of the display device, wherein the display panel includes:

the pair of first fragmented metal lines for supplying a bias voltage disposed on a protective film and separated from each other by a predetermined spacing;

a first middle layer for planarization disposed on the pair of first fragmented metal lines;

the second metal line for supplying the bias voltage disposed on the first middle layer, wherein the second metal line has a length equal to the predetermined spacing between the pair of first fragmented metal lines, wherein both opposing ends of the second metal line in a length direction pass through the first middle layer and are electrically connected to the pair of first fragmented metal lines via two contact holes, and a gate line for supplying a scan signal, wherein the gate line extends lengthwise parallel to the pair of first fragmented metal lines and is disposed between the pair of first fragmented metal lines that supply the bias voltage.

27. The display device of claim 26, a charge amount for the gate line and a charge amount for the pair of first fragmented metal lines is maintained by preventing charge accumulation on the pair of first fragmented metal lines.

* * * * *